(12) United States Patent
Yamazaki et al.

(10) Patent No.: US 7,728,326 B2
(45) Date of Patent: Jun. 1, 2010

(54) LIGHT EMITTING DEVICE AND ELECTRONIC APPARATUS

(75) Inventors: Shunpei Yamazaki, Tokyo (JP); Toru Takayama, Kanagawa (JP)

(73) Assignee: Semiconductor Energy Laboratory Co., Ltd., Kanagawa-Ken (JP)

(*) Notice: Subject to any disclaimer, the term of this patent is extended or adjusted under 35 U.S.C. 154(b) by 44 days.

(21) Appl. No.: 11/723,437

(22) Filed: Mar. 20, 2007

(65) Prior Publication Data

US 2007/0164295 A1    Jul. 19, 2007

Related U.S. Application Data

(60) Division of application No. 10/235,839, filed on Sep. 6, 2002, now Pat. No. 7,211,828, which is a continuation-in-part of application No. 10/174,547, filed on Jun. 19, 2002, now Pat. No. 6,849,877.

(30) Foreign Application Priority Data

Jun. 20, 2001  (JP)  ............................. 2001-187351
Sep. 6, 2001   (JP)  ............................. 2001-270694

(51) Int. Cl.
    *H01L 35/24*   (2006.01)
(52) U.S. Cl. .................. 257/40; 257/79; 257/99; 257/E51.018; 257/E51.019; 257/E51.02; 257/E51.021; 257/E51.022
(58) Field of Classification Search .................. 257/79, 257/40, 99, E51.018–22
    See application file for complete search history.

(56) References Cited

U.S. PATENT DOCUMENTS

| 4,489,481 A | 12/1984 | Jones |
| 5,107,175 A | 4/1992 | Hirano et al. |
| 5,124,204 A | 6/1992 | Yamashita et al. |
| 5,189,405 A | 2/1993 | Yamashita et al. |

(Continued)

FOREIGN PATENT DOCUMENTS

EP    0777280    6/1997

(Continued)

OTHER PUBLICATIONS

Erlat, characteristics of aluminium oxynitride gas barrier film, thin solid films 388, p. 78-86, 2001.*
Tsutsui et al., "Electroluminescence in Organic Thin Films", Photochemical Processes in Organized Molecular Systems, 1991, pp. 437-450.

(Continued)

*Primary Examiner*—Kiesha R Bryant
*Assistant Examiner*—Minchul Yang
(74) *Attorney, Agent, or Firm*—Nixon Peabody LLP; Jeffrey L. Costellia

(57) ABSTRACT

A light emitting device which is capable of suppressing deterioration by diffusion of impurities such as moisture, oxygen, alkaline metal and alkaline earth metal, and concretely, a flexible light emitting device which has light emitting element formed on a plastic substrate. On the plastic substrate, disposed are two layers and more of barrier films comprising a layer represented by AlNxOy which is capable of blocking intrusion of moisture and oxygen in a light emitting layer and blocking intrusion of impurities such as an alkaline metal and an alkaline earth metal in an active layer of TFT, and further, a stress relaxation film containing resin is disposed between two layers of barrier films.

49 Claims, 15 Drawing Sheets

U.S. PATENT DOCUMENTS

| | | | |
|---|---|---|---|
| 5,455,625 A | 10/1995 | Englander | |
| 5,583,369 A | 12/1996 | Yamazaki et al. | |
| 5,627,364 A | 5/1997 | Codama et al. | |
| 5,674,304 A | 10/1997 | Fukada et al. | |
| 5,681,759 A | 10/1997 | Zhang | |
| 5,686,360 A | 11/1997 | Harvey, III et al. | |
| 5,693,956 A | 12/1997 | Shi et al. | |
| 5,696,386 A | 12/1997 | Yamazaki | |
| 5,736,207 A | 4/1998 | Walther et al. | |
| 5,750,267 A | 5/1998 | Takase et al. | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,821,138 A | 10/1998 | Yamazaki et al. | |
| 5,834,327 A | 11/1998 | Yamazaki et al. | |
| 5,900,285 A | 5/1999 | Walther et al. | |
| 5,946,561 A | 8/1999 | Yamazaki et al. | |
| 5,952,778 A | 9/1999 | Haskal et al. | |
| 5,973,449 A | 10/1999 | Nakamura et al. | |
| 6,084,579 A * | 7/2000 | Hirano | 345/205 |
| 6,127,199 A | 10/2000 | Inoue et al. | |
| 6,144,108 A | 11/2000 | Ohizumi et al. | |
| 6,146,225 A | 11/2000 | Sheats et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,268,631 B1 | 7/2001 | Fukada et al. | |
| 6,268,695 B1 | 7/2001 | Affinito | |
| 6,287,955 B1 | 9/2001 | Wang et al. | |
| 6,329,087 B1 | 12/2001 | Okamoto | |
| 6,372,608 B1 | 4/2002 | Shimoda et al. | |
| 6,376,105 B1 | 4/2002 | Jonas et al. | |
| 6,376,333 B1 | 4/2002 | Yamazaki et al. | |
| 6,413,645 B1 | 7/2002 | Graff et al. | |
| 6,432,516 B1 | 8/2002 | Terasaki et al. | |
| 6,448,710 B1 | 9/2002 | Asai et al. | |
| 6,475,845 B2 | 11/2002 | Kimura | |
| 6,497,598 B2 | 12/2002 | Affinito | |
| 6,522,067 B1 | 2/2003 | Graff et al. | |
| 6,533,631 B2 | 3/2003 | Suzuki et al. | |
| 6,541,294 B1 | 4/2003 | Yamazaki et al. | |
| 6,548,912 B1 | 4/2003 | Graff et al. | |
| 6,570,325 B2 | 5/2003 | Graff et al. | |
| 6,573,652 B1 | 6/2003 | Graff et al. | |
| 6,586,772 B2 | 7/2003 | Bijlsma | |
| 6,623,861 B2 | 9/2003 | Martin et al. | |
| 6,624,568 B2 | 9/2003 | Silvernail | |
| 6,627,518 B1 | 9/2003 | Inoue et al. | |
| 6,639,360 B2 | 10/2003 | Roberts et al. | |
| 6,700,631 B1 | 3/2004 | Inoue et al. | |
| 6,720,203 B2 | 4/2004 | Carcia et al. | |
| 6,771,677 B2 | 8/2004 | Furukawa et al. | |
| 6,849,877 B2 | 2/2005 | Yamazaki et al. | |
| 6,866,901 B2 | 3/2005 | Burrows et al. | |
| 6,885,389 B2 | 4/2005 | Inoue et al. | |
| 6,923,702 B2 | 8/2005 | Graff et al. | |
| 6,936,846 B2 * | 8/2005 | Koyama et al. | 257/71 |
| 6,962,671 B2 | 11/2005 | Martin et al. | |
| 7,005,798 B2 | 2/2006 | Carcia et al. | |
| 7,060,153 B2 | 6/2006 | Yamazaki et al. | |
| 7,198,832 B2 | 4/2007 | Burrows et al. | |
| 7,214,555 B2 | 5/2007 | Yamazaki et al. | |
| 7,271,858 B2 | 9/2007 | Yamazaki et al. | |
| 2001/0001485 A1 | 5/2001 | Bao et al. | |
| 2001/0002703 A1 * | 6/2001 | Koyama | 257/40 |
| 2001/0011726 A1 | 8/2001 | Hayashi et al. | |
| 2001/0026835 A1 | 10/2001 | Tanaka | |
| 2001/0030323 A1 | 10/2001 | Ikeda | |
| 2001/0040645 A1 | 11/2001 | Yamazaki | |
| 2002/0017643 A1 | 2/2002 | Koyama | |
| 2002/0047120 A1 | 4/2002 | Inukai | |
| 2002/0125817 A1 | 9/2002 | Yamazaki et al. | |
| 2002/0125822 A1 * | 9/2002 | Graff et al. | 313/506 |
| 2002/0153829 A1 | 10/2002 | Asai et al. | |
| 2003/0027369 A1 | 2/2003 | Yamazaki | |
| 2003/0117066 A1 * | 6/2003 | Silvernail | 313/504 |
| 2003/0155573 A1 | 8/2003 | Yamazaki et al. | |
| 2003/0206332 A1 | 11/2003 | Yamazaki et al. | |
| 2005/0176181 A1 | 8/2005 | Burrows et al. | |
| 2007/0164376 A1 | 7/2007 | Burrows et al. | |
| 2007/0196682 A1 | 8/2007 | Visser et al. | |
| 2007/0210459 A1 | 9/2007 | Burrows et al. | |

FOREIGN PATENT DOCUMENTS

| | | |
|---|---|---|
| EP | 0986104 | 3/2000 |
| EP | 1014452 | 6/2000 |
| EP | 1686626 | 8/2006 |
| JP | 64-059791 | 3/1989 |
| JP | 04-014440 | 1/1992 |
| JP | 05-315630 | 11/1993 |
| JP | 06-013180 | 1/1994 |
| JP | 07-065950 | 3/1995 |
| JP | 08-068990 | 3/1996 |
| JP | 08-111516 | 4/1996 |
| JP | 08-124677 | 5/1996 |
| JP | 08-262474 | 10/1996 |
| JP | 08-288522 | 11/1996 |
| JP | 08-318590 | 12/1996 |
| JP | 09-082476 | 3/1997 |
| JP | 09-161967 | 6/1997 |
| JP | 09-260059 | 10/1997 |
| JP | 10-125929 | 5/1998 |
| JP | 10-125931 | 5/1998 |
| JP | 2000-173027 A | 7/1999 |
| JP | 11-251517 | 9/1999 |
| JP | 11-312811 | 11/1999 |
| JP | 2000-100577 | 4/2000 |
| JP | 2000-133450 | 5/2000 |
| JP | 2000-323173 | 11/2000 |
| JP | 2000-323273 | 11/2000 |
| JP | 2000-357585 | 12/2000 |
| JP | 2001-009963 | 1/2001 |
| JP | 2001-051296 | 2/2001 |
| JP | 2001-057286 | 2/2001 |
| JP | 2001-118674 | 4/2001 |
| JP | 2001-272923 | 10/2001 |
| JP | 2002-082633 | 3/2002 |
| JP | 2002-532850 | 10/2002 |
| JP | 2002-543563 | 12/2002 |
| KR | 2001-0006343 A | 1/2001 |
| WO | WO-00/36665 | 6/2000 |
| WO | WO-00/65670 | 11/2000 |

OTHER PUBLICATIONS

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

Tsutsui et al., "High Quantum Efficiency in Organic Light-Emitting Devices with Iridium-Complex as a Triplet Emissive Center", Japanese Journal of Applied Physics vol. 38, Part 2, No. 12B, Dec. 15, 1999, pp. L1502-L1504.

Notice of Preliminary Rejection, Office Action in Korean Patent Application No. 2002-0034626; KR5800) dated Jan. 20, 2009, with English translation.

Office Action (Japanese Patent Application No. 2002-176571), dated Feb. 12, 2008.

* cited by examiner

LIGHT EMITTING DEVICE AND ELECTRONIC APPARATUS

This application is a Divisional of application Ser. No. 10/235,839 filed Sep. 6, 2002, now U.S. Pat. No. 7,211,828 which is a Continuation-In-Part of application Ser. No. 10/174,547 filed Jun. 19, 2002, now U.S. Pat. No 6,849,877.

BACKGROUND OF THE INVENTION

The present invention relates to a light emitting device, especially, a light emitting device having a light emitting diode formed on a plastic substrate. In addition, it relates to a module using a light emitting diode that mounts IC and the like in which a controller is include in the panel using a light emitting diode. In this specification, the light emitting device is a general term for the panel using a light emitting diode and the module using a light emitting diode. Further, the present invention is related to an electric apparatus using the light emitting device.

In recent years, a technology constituting a thin film transistor (TFT) using a semiconductor thin film (in the range from about a few to a few hundreds nm in thickness) formed on the substrate having an insulating surface has drawn attention. A thin film transistor is widely applied to electronic devices such as an IC, an electro-optic device or the like, and particularly, there is an urgent need to be developed as a switching element for an image display device.

Although as for applications utilizing such an image display device, a variety of applications are expected, particularly, its utilization for portable apparatuses has drawn the attention. At present, although many glass substrates and quartz substrates are utilized, there are defaults of being easily cracked and heavy. Moreover, the glass substrates and quartz substrates are difficult to be made larger in terms of conducting a mass-production, and these are not suitable for that. Therefore, the attempt that a switching element is formed on a substrate having flexibility, representatively, on a flexible plastic film has been performed.

However, since the heat resistance of a plastic film is low, it cannot help lowering the highest temperature of the process. As a result, at present, a TFT is formed which has not so excellent electric characteristics compared with those formed on the glass substrates. Therefore, light emitting element having a high performance by utilizing a plastic film have not been realized yet.

In these years, research of an active matrix type light emitting device (hereinafter, simply referred to as a light emitting device) having a light emitting diode as a self-luminescence type element is intensified. The light emitting device is also called as an organic EL display or a light emitting diode.

The light emitting diode has high visibility since it emits light for itself and does not need a backlight which is necessary in a liquid crystal display, and it is optimum to be made thinner, and there is no limitation about a visual field angle. Therefore, a light emitting device using the light emitting diode is noticed as a display apparatus taking the place of CRTs and LCDs.

In case that it becomes possible to make a light emitting device in which a light emitting element is formed on a substrate having flexibility such as plastic film, it is thin in thickness and of light weight and can be used for a display having a curved surface and a show window. Therefore, its application is not limited only to portable apparatuses but it has a broader range of applications.

However, a substrate comprising a plastic is generally easy to transmit moisture and oxygen through it, and deterioration of a light emitting layer is expedited by these staffs, and therefore, a light emitting device is particularly easy to be short-lived. Thus, in the related art, an insulating film which comprises silicon nitride and silicon nitride oxide is disposed between a plastic substrate and a light emitting diode so that mixture of moisture and oxygen in the light emitting layer is prevented. However, in the insulating film which comprises silicon nitride and silicon nitride oxide, it is hard to adequately prevent moisture and oxygen from being mixed in the light emitting layer.

In addition, a substrate such as a plastic film is generally weak against heat, and in case that temperature for forming an insulating film such as silicon nitride and silicon nitride oxide is raised too much, the substrate is made to be easily transformed. Further, in case that film forming temperature is too low, film characteristic is deteriorated so that it becomes hard to adequately prevent moisture and oxygen from being mixed.

Further, in case that driven is an element which is disposed on the substrate such as the plastic film, it becomes an issue that heat is developed locally so that a part of the substrate is transformed and degenerated.

Furthermore, in case that thickness of the insulating film such as silicon nitride and silicon nitride oxide is increased in order to prevent moisture and oxygen from being mixed, stress is enlarged so that it becomes easy to suffer some cracks. Moreover, in case that film thickness is increased, the film is apt to suffer some cracks when the substrate is bent. Further, when the substrate is peeled off, a layer to be peeled off is bent and the layer to be peeled off suffers some cracks.

Further, in case of a TFT, when impurities such as an alkaline metal (Li, Cs, Na etc.) and an alkaline earth metal (Ca, Mg etc.) and other metal elements are diffused in an active layer in addition to moisture and oxygen, characteristic is apt to be changed.

Furthermore, even after final products are made, in case that other impurities, for example, human sweat and impurities from connecting components, are diffused and mixed in the light emitting layer and the active layer of TFT, there is a possibility that degeneration and deterioration are expedited.

SUMMARY OF THE INVENTION

The present invention is, in light of the above problems, to provide a light emitting device which is capable of suppressing deterioration due to diffusion of impurities such as moisture, oxygen, an alkaline metal and an alkaline earth metal, and concretely, a light emitting device having the light emitting element which is formed on the plastic substrate.

In the present invention, a film (hereinafter, referred to as a barrier film) is provided on the plastic substrate, which is represented by AlNxOy, that can prevent oxygen and water from penetrating into a light emitting layer, and impurities such as alkaline metal and alkaline-earth metal from penetrating into an active layer of TFT.

A structure of an invention disclosed in this specification is that: a light emitting device that is characterized in that it comprises a light emitting elements which comprises a cathode, an organic compound layer contacting the cathode and an anode contacting the organic compound layer, on a substrate having an insulating surface, wherein disposed is a layer which contacts the substrate and is represented by AlNxOy.

Further, a oxynitride layer containing above-mentioned aluminum is a film containing nitrogen in the range from 2.5 atm % to 47.5 atm %, characterized by the fact that it has an effect capable of blocking water content and oxygen, in addition to this, has a high thermal conductivity and an effect of heat release, and further, has a very high translucency. In addition, it can prevent impurities such as alkali metal, alkaline earth metal or the like from penetrating into the active layer of TFT.

The light emitting device can be structured to prevent oxygen and water from penetrating into a light emitting layer by sandwiching between two substrates. As another structure of the present invention is that: a light emitting device in which a light emitting element having a cathode, an organic compound layer contacting the cathode and an anode contacting the organic compound layer is sandwiched between a first substrate and a second substrate, wherein a lamination layer of a layer which is represented by AlNxOy and a layer which comprises an organic resin is disposed on the first substrate or the second substrate, and the light emitting element is covered by a layer which is represented by AlNxOy.

Further, two substrates are bonded to each other by a bonding layer when the light emitting element is sandwiched between the two substrates. Even if the barrier film is provided to each of both substrates, there is problem that impurities such as moisture and oxygen are penetrated through the bonding layer. Accordingly, a layer which is represented by AlNxOy is used as a passivation film (protective film), and a structure in which the light emitting element is covered with a barrier film and the passivation film. In addition, two or more passivation films made of layers represented by AlNxOy are provided, and a stress relaxing film containing a resin (hereinafter, referred to as a stress relaxing film) is provided between the two passivation films. Total stress can be relaxed by sandwiching the stress relaxing film having smaller stress than the passivation film between the passivation films.

In the present invention, a lamination layer which comprises a barrier film for preventing moisture and oxygen from penetrating into a light emitting layer and an organic resin layer having smaller stress than the barrier film (stress relaxing layer) can be provided over a plastic substrate. Another structure of the invention disclosed in this specification is that: a light emitting device is characterized in that it comprises a light emitting elements which comprises a cathode, an organic compound layer contacting the cathode and an anode contacting the organic compound layer, on a substrate having an insulating surface, wherein a laminated layer having a layer represented by AlNxOy and a layer comprising organic resin is provide in contact with the substrate.

The light emitting device can be structured to prevent oxygen and water from penetrating into a light emitting layer by sandwiching between two substrates. As another structure of the present invention is that: a light emitting device in which a light emitting element having a cathode, an organic compound layer contacting the cathode and an anode contacting the organic compound layer is sandwiched between a first substrate and a second substrate, wherein a laminated layer having a layer represented by AlNxOy and a layer comprising organic resin is provide in contact with the substrate, and the light emitting element is covered by a layer represented by AlNxOy.

Specifically, two or more barrier films made of layers represented by AlNxOy are provided. Furthermore, a stress relaxing film containing a resin (hereinafter, referred to as a stress relaxing film) is provided between the two barrier films. Then, a light emitting element is formed on these three or more layers of the insulating films. The light emitting element is sealed to complete a light emitting device.

According to the present invention, a plurality of barrier films made of layers represented by AlNxOy are laminated. In this manner, even if a crack occurs in one of the barrier films, the other barrier film(s) can effectively prevent moisture or oxygen from penetrating into the light emitting layer, and moreover, effectively prevent impurities such as alkaline metal from penetrating into the active layer of TFT.

Furthermore, a stress relaxing film, which has a smaller stress than that of the barrier film, is sandwiched between the barrier films to reduce the entire stress.

Accordingly, a multi-layered barrier film can effectively prevent moisture or oxygen from penetrating into the light emitting layer as compared with a single-layered barrier film having the same thickness. In addition, a crack due to stress hardly occurs in such a multi-layered barrier film.

Moreover, a laminate structure of barrier films and a stress relaxing film provides a further flexibility to a device, thereby preventing a crack upon bend of the substrate. Also, from the experiment, it was found that a layer represented by AlNxOy has high adhesiveness for the film substrate having flexibility compared with the silicon nitride and aluminum nitride.

Moreover, in above mentioned each structures, a laminate structure made of the organic resin is characterized in that it is composed of a single layer or lamination layer selected from a smaller stress material than that of a layer represented by AlNxOy, such as polyimide, acryl, polyamide, polyimideamide, benzocyclobutene, epoxy resin or the like. In addition, in above-mentioned each structures, a layer made of the organic resin is characterized in that it have a bonding layer that adhere the substrate.

In above-mentioned each structures, the substrate is non-limiting if the substrate is a plastic film having flexibility. The substrate is a plastic substrate composed of one kind or plural kinds of material as follows, for example, polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide or the like.

Another structure of the present invention is that a light emitting device having a light emitting element which comprises a cathode, an organic compound layer contacting the cathode and an anode contacting the organic compound layer over a polyimide substrate on which a lamination layer comprising a layer which is represented by AlNxOy, an organic resin on the layer which is represented by AlNxOy, and a layer which is represented by AlNxOy on the organic resin.

Another structure of the present invention is that a light emitting device having a light emitting element which comprises a cathode, an organic compound layer contacting the cathode and an anode contacting the organic compound layer over a polyethylene sulfayl substrate on which a lamination layer comprising a layer which is represented by AlNxOy, an organic resin on the layer which is represented by AlNxOy, and a layer which is represented by AlNxOy on the organic resin.

Another structure of the present invention is that a light emitting device having a light emitting element which comprises a cathode, an organic compound layer contacting the cathode and an anode contacting the organic compound layer over a polycarbonate substrate on which a lamination layer comprising a layer which is represented by AlNxOy, an organic resin on the layer which is represented by AlNxOy, and a layer which is represented by AlNxOy on the organic resin.

Another structure of the present invention is that a light emitting device having a light emitting element which comprises a cathode, an organic compound layer contacting the cathode and an anode contacting the organic compound layer over a polyethylene terephthalate substrate on which a lamination layer comprising a layer which is represented by AlNxOy, an organic resin on the layer which is represented by AlNxOy, and a layer which is represented by AlNxOy on the organic resin.

Another structure of the present invention is that a light emitting device having a light emitting element which comprises a cathode, an organic compound layer contacting the cathode and an anode contacting the organic compound layer over a polyethylene naphthalate substrate on which a lamination layer comprising a layer which is represented by AlNxOy, an organic resin on the layer which is represented by AlNxOy, and a layer which is represented by AlNxOy on the organic resin.

Another structure of the present invention is that an electronic apparatus having one or more of a layer which is represented by AlNxOy or a layer which comprises an organic resin between an light emitting device and outside.

Further, in the above-mentioned each structures, the layer represented by AlNxOy is characterized in that it contains an element of the Group 15 of periodic table or an element of the Group 13 of periodic table in the range from 0.1 atm % to 5 atm %.

Besides, in the above-mentioned each structure, the layer represented by AlNxOy is characterized in that it contains phosphorus element or boron element in the range from 0.1 atm % to 5 atm %.

The layer represented by AlNxOy in the above-mentioned each structures dissipates heat from the elements and therefore has the effect of limiting degradation of the elements as well as the effect of preventing deformation and change in quality of the plastic substrate.

A light emitting layer is defined in this specification as an aggregate of layers formed between an anode and cathode of a light emitting element. Specifically, a light emitting layer includes a light emitting layer, a hole injecting layer, an electron injecting layer, a hole transporting layer, an electron transporting layer, etc. The basic structure of light emitting element is a laminate of an anode, a light emitting layer, and a cathode layered in order. The basic structure may be modified into a laminate of an anode, a hole injecting layer, a light emitting layer, and a cathode layered in order, or a laminate of an anode, a hole injecting layer, a light emitting layer, an electron transporting layer, and a cathode layered in order.

A light emitting element has, in addition to an anode and a cathode, a layer containing an organic compound (light emitting material) that generates luminescence (electro luminescence) when an electric field is applied (the layer is hereinafter referred to a light emitting layer). Luminescence obtained from organic compounds is classified into light emission in returning to the base state from singlet excitation (fluorescence) and light emission in returning to the base state from triplet excitation (phosphorescence). A light emitting device of the present invention may use one or both of the above two types of light emission.

DETAILED DESCRIPTION OF THE PREFERRED EMBODIMENTS

Hereinafter, the preferred embodiments of the invention will be described.

Figure 1A:
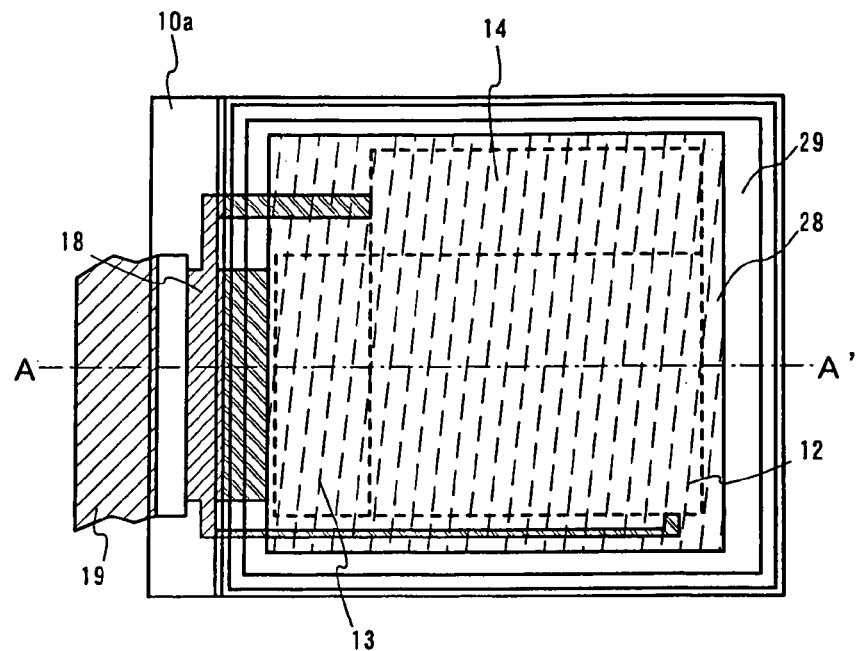
FIGS. 1A and 1B are a top view and a sectional view of an EL module, respectively.
Figure 1B:
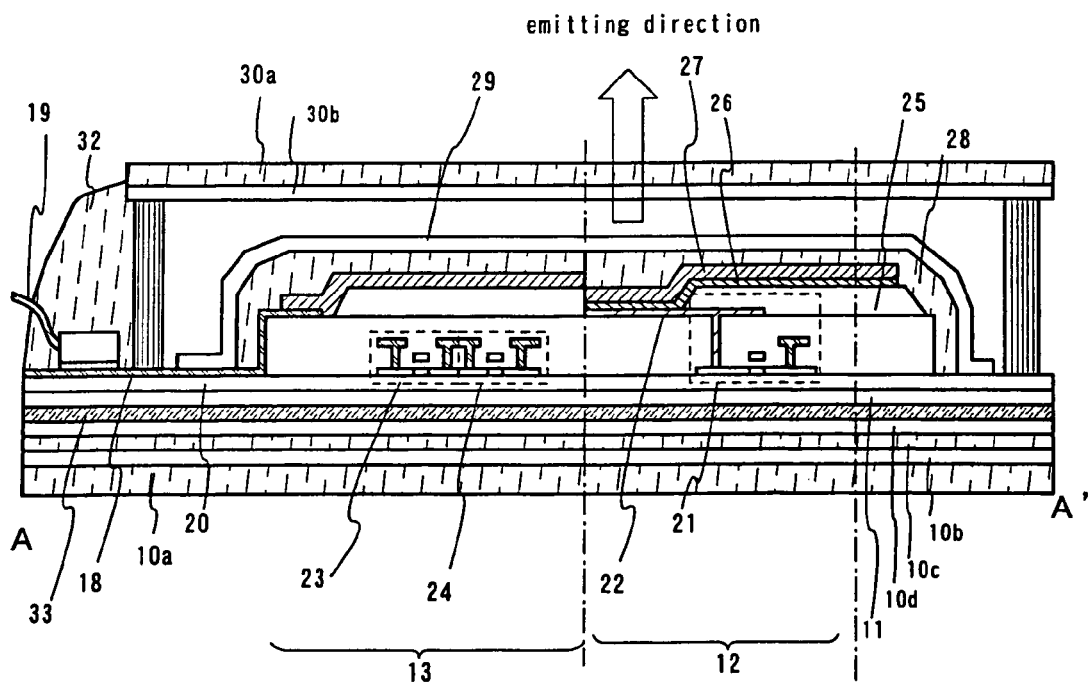

FIG. 1A is a top view which shows an EL module, and FIG. 1B is a sectional view cut along the line of A-A' of FIG. 1A. In FIG. 1B, a film substrate 10a (for example, a plastic substrate) having flexibility on which surface, disposed is a lamination layer of a layer 10b which functions as a barrier film and is represented by AlNxOy (called also as an AlNxOy film) and a stress relaxation film (organic resin) 10c and an AlNxOy film 10d, is adhered to an insulating film 11 by an adhesive layer 33. In addition, a material which stress is smaller than that of the barrier film may be used as the adhesive layer 33 and it may be made to function as a stress relaxation film. As just described, by layering a plurality of barrier films 10b and 10d, even in case that the barrier film suffers some cracks, other barrier film effectively prevents impurities such as moisture and oxygen from getting into the light emitting layer. In addition, by disposing the stress relaxation film between a plurality of barrier films, obtained is a light emitting device which is more flexible and cracks may be prevented when it is bent.

Figure 12:
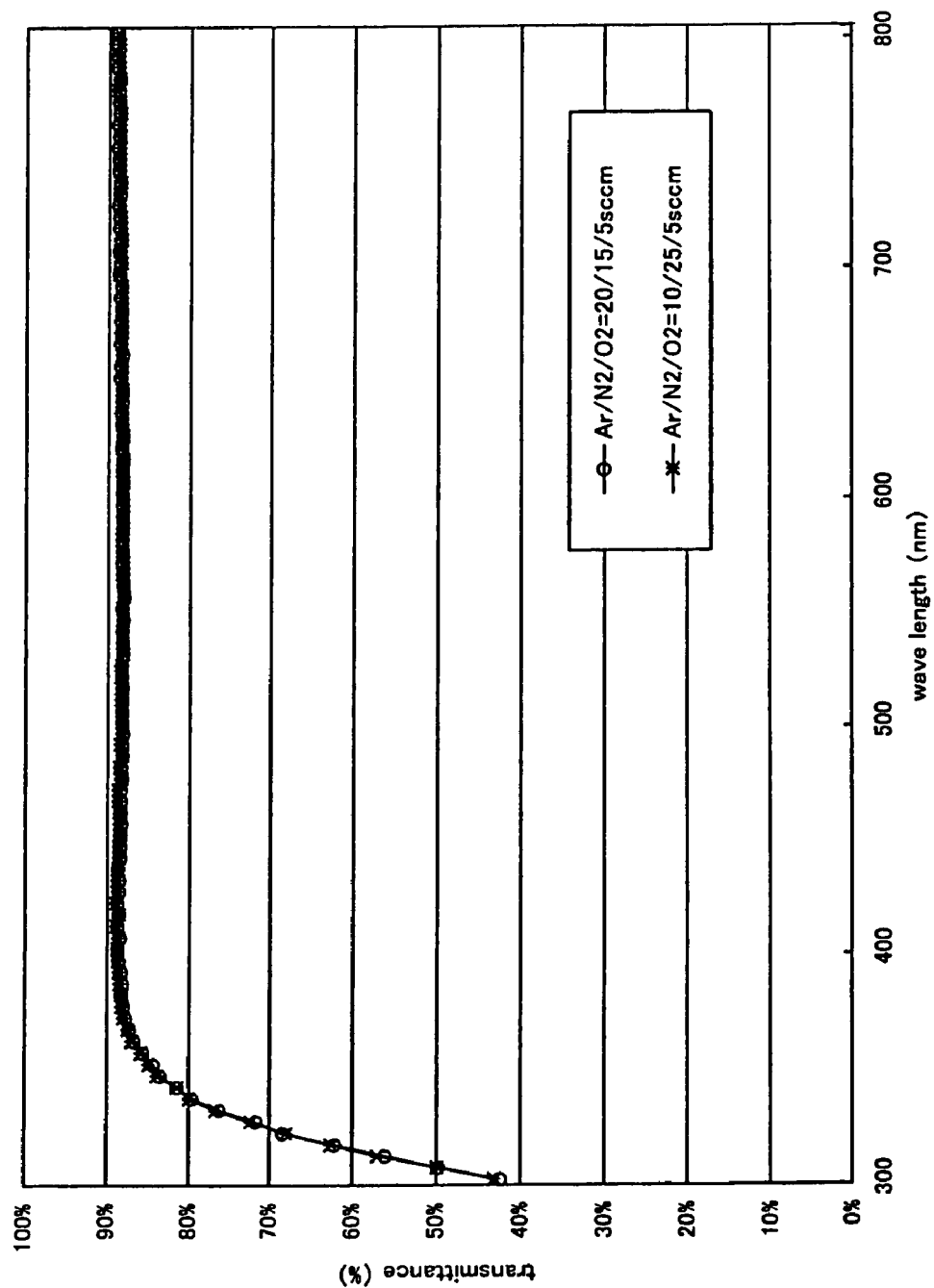
FIG. 12 is a graph which shows transmission factor of AlNxOy film of the invention.

Further, FIG. 12 shows a transmission factor of the AlNxOy film in thickness of 100 nm. As shown in FIG. 12, the AlNxOy film has very high translucency (transmission rate is 80%-91.3% in a visible light area), and it does not block light emission from the light emitting element.

Figure 13:
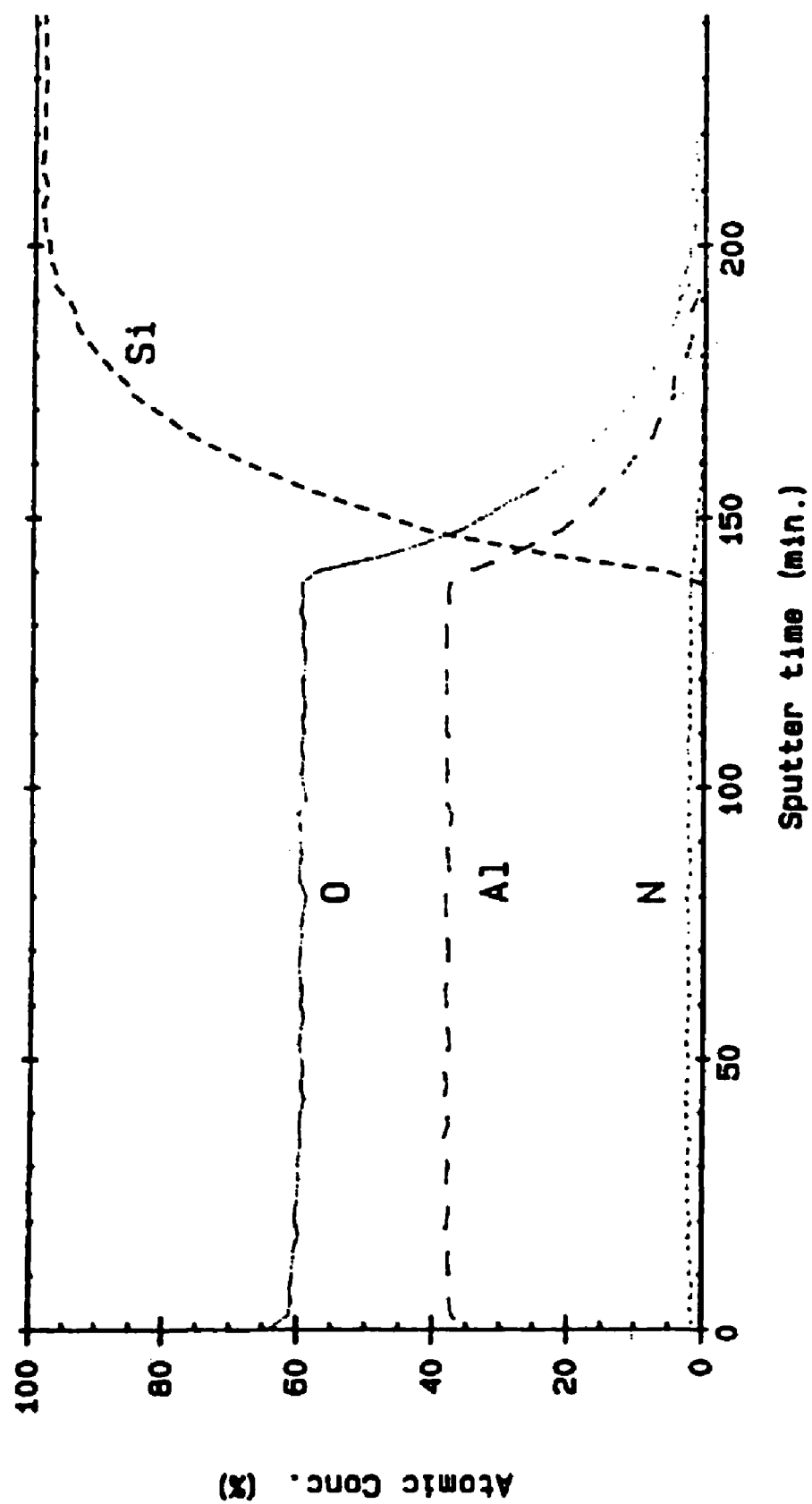
FIG. 13 is an ESCA analysis result of AlNxOy film of the invention.

In the invention, the AlNxOy film is formed by use of a spattering method and for example, film forming is carried out by use of an aluminum nitride (AlN) target, under an atmosphere which argon gas, nitrogen gas and oxygen gas are mixed. The AlNxOy film may have nitrogen of several atm % and more, and preferably fall within a range including 2.5 atm %-47.5 atm %, and by adjusting spattering conditions (substrate temperature, source gas and its flow volume, film forming pressure) at pleasure, nitrogen density can be adjusted. In addition, FIG. 13 shows a composition of the obtained AlNxOy film by ESCA (Electron Spectroscopy for Analysis) analysis. Further, film forming may be carried out by use of an aluminum (Al) target, under an atmosphere containing nitrogen gas and oxygen gas. In addition, the method is not limited to the spattering method, and deposition method and other well known technologies may be used.

Further, in order to confirm an effect for blocking moisture and oxygen by the AlNxOy film, prepared were a sample in which light emitting element is sealed by a film substrate on which AlNxOy film having film thickness of 200 nm is formed and a sample in which light emitting element is sealed by a film substrate on which SiN film having film thickness of 200 nm is formed, and conducted was an experiment in which variation per hour is checked under a vapor atmosphere heated at 85° C., and as a result, as compared with the sample of SiN film, the sample of AlNxOy film has longer life of light emitting element so that it became possible to carry out long light emission. From this experiment result, it is perceived that the AlNxOy film is a material film which blocks intrusion from outside of the device, of a material for inducing deterioration of an organic compound layer, something like impurities such as moisture and oxygen, rather than the SiN film.

Figure 14:
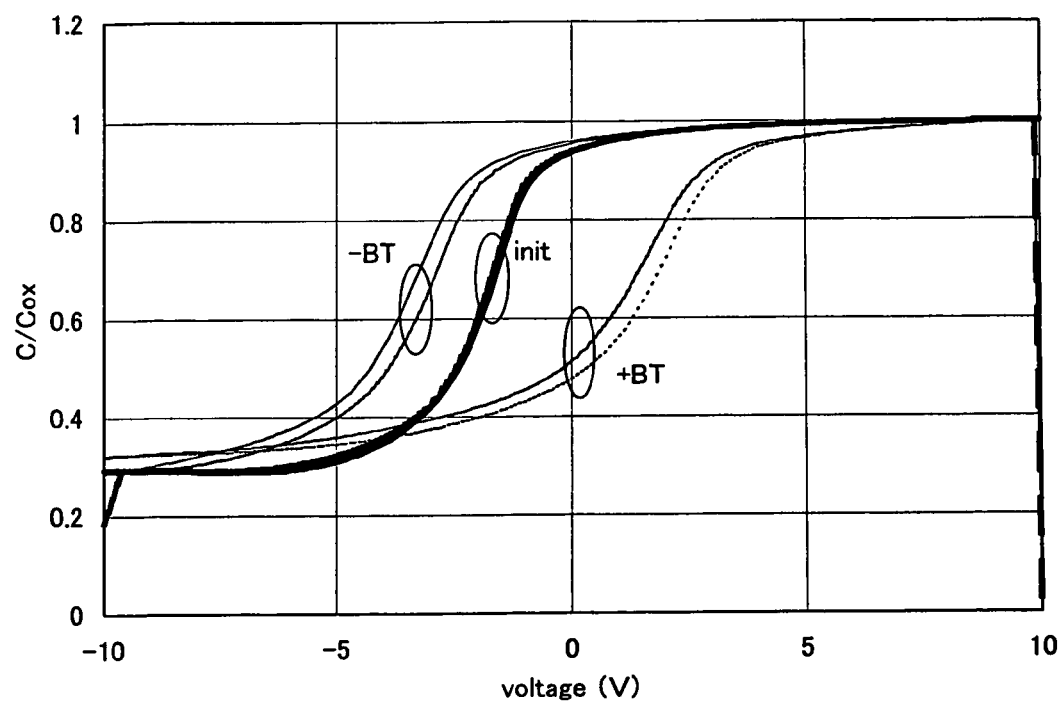
FIG. 14 is a MOS characteristic (AlNxOy film) in BT stress.
Figure 15:
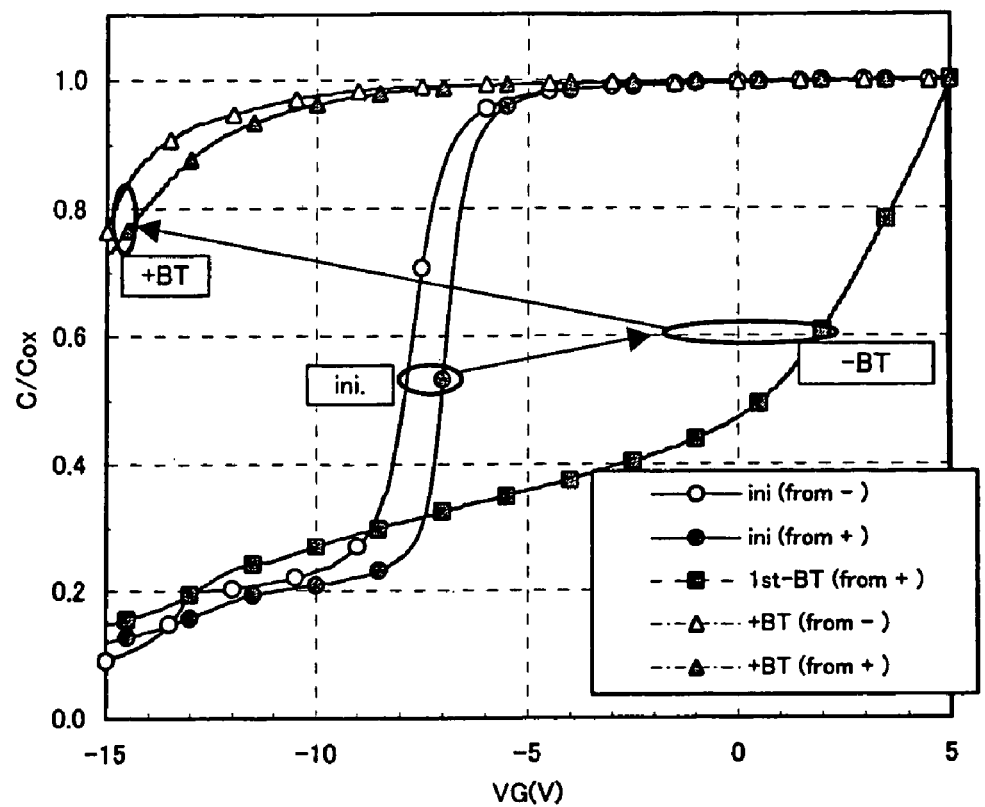
FIG. 15 is a MOS characteristic (SiN film) (comparative example) in BT stress.

Furthermore, in order to confirm an effect for blocking an alkaline metal by the AlNxOy film, a thermally-oxidized film with film thickness of 50 nm is disposed on a silicon substrate, and the AlNxOy film with film thickness of 40 nm is disposed thereon and an aluminum electrode containing Li is disposed thereon, and an aluminum electrode containing Si is disposed on the silicon substrate at a position opposite to a surface on which the above films are disposed, and after one hour thermal processing is carried out at temperature of 300° C., a BT stress test (±1.7 MV/cm, 150° C., 1 hour) is carried out to measure a MOS characteristic (C-V characteristic). FIG. 14 shows the result of the experiment. The C-V characteristic shown in FIG. 14, when a positive voltage is applied, i.e., in case of +BT, is shifted to a positive side, and therefore, it was confirmed that cause of such shift is not Li and there exists the effect for blocking the alkaline metal by the AlNxOy film. For comparison, on MOS, an AlLi alloy is formed through an insulating film (silicon nitride film with film thickness of 100 nm), and at the same time, characteristic variation of the MOS was investigated. The result is shown in FIG. 15. When a positive voltage is applied, i.e., in case of +BT, C-V characteristic variation shown in FIG. 15 is largely shifted to a negative side, and it is contemplated that its cause is that mainly Li is mixed in an active layer.

Further, may be used a structure in which only both sides of the plastic substrate are covered by the AlNxOy film.

In addition, here, insulating films 11 and 20 are disposed on a substrate having heat resistance, a pixel part 12, a source side driving circuit 14 and a gate side driving circuit 13 are formed thereon, and thereafter, a covering member is adhered to fix them and the substrate having heat resistance is peeled off, and thereafter, the film substrate is attached, but this is not particularly limited, and it should be appreciated that the film substrate may be a film substrate which can resist temperature for forming the pixel part 12, the source side driving circuit 14 and the gate side driving circuit 13, and the pixel part 12, the source side driving circuit 14 and the gate side driving circuit 13 are formed on the film substrate and in that case, it is not necessary to dispose an adhesive layer.

A technology for peeling the substrate having heat resistant (a glass substrate and a quartz substrate) is not limited particularly, and here, used is a method for peeling by use of internal stress of a film, to be more precise, a method in which disposed on the substrate having heat resistance is a lamination film of a first material layer and a second material layer in which abnormality on a process such as peeling due to thermal processing does not occur and an element (TFT and a light emitting element) is formed on the lamination layer and thereafter, it is finely separated easily in a layer or a boundary surface of the second material layer by physical means, typically by applying a mechanical force, for example, peeling off by use of a human hand. Since a bonding force of the first material layer and the second material layer has a strength which can resist against thermal energy and right before peeling, has a stress distortion between the first material layer having tensile stress and the second material layer having compression stress, it is weak to mechanical energy and thus the first and second material layers are peeled off. Here, since the peeling was carried out by using a tungsten film as the first material layer and by using a silicon oxide film by spattering method as the second material layer, the insulating film 11 corresponds to the second material layer.

Further, as another technology for peeling off the substrate having heat resistance, a peeling method for peeling off a layer to be peeled off through a separation layer from the substrate (Japanese Patent Laid-Open No. 10-125929 gazette, Japanese Patent Laid-Open No. 10-125931 gazette) may be used. A technology described in the gazettes is one in which a separation layer which comprises amorphous silicon (or polysilicon) is disposed, and hydrogen contained in the amorphous silicon is discharged by irradiating laser light through the substrate so that an air gap is formed and thereby, the substrate is separated.

In FIG. 1B, on the insulating film 20, the pixel part 12 and the gate side driving circuit 13 are formed, and the pixel part 12 is formed by a plurality of pixels containing a TFT 21 for current control and a pixel electrode (cathode) 22 which is electrically connected to its drain. As the TFT 21 for current control, it is possible to use a p-channel type TFT but preferable to use an n-channel type TFT. Further, the gate side driving circuit 13 is formed by use of a CMOS circuit which is configured by combining an n-channel type TFT 23 and a p-channel type TFT 24. As an active layer of each TFT, a semiconductor film (polysilicon film) having a crystal structure and a semiconductor film (for example, amorphous silicon film) having an amorphous structure are used.

Further, the pixel electrode 22 functions as a cathode of a light emitting element. Furthermore, at both sides of the pixel electrode 22, a bank 25 is formed, and on the pixel electrode 22, an organic compound layer 26 and an anode 27 of the light emitting element are formed.

As the organic compound layer 26, it should be appreciated that the organic compound layer (a layer for carrying out light emission and movement of carriers therefore) may be formed by freely combining a light emitting layer, an electric charge transport layer or an electric charge injection layer. For example, low molecular series organic compound material and high molecular series organic compound material may be used. Further, as the organic compound layer 26, a thin film which comprises a light emitting material (singlet compound) which emits light by singlet excitation, or a thin film which comprises a light emitting material (triplet compound) which emits light (phosphorous light) by triplet excitation may be used. Furthermore, it is possible to use an inorganic material such as silicon carbide as the electric charge transport layer and the electric charge injection layer. As these organic and inorganic materials, well-know materials can be used.

The anode 27 functions as a common wiring to all pixels, and is electrically connected to an FPC 19 through a connection wiring 18. Further, elements which are contained in the pixel part 12 and the gate side driving circuit 13 are all covered by the anode 27, an organic resin 28 and a protective film 29.

Further, in FIG. 1A, 28 represents the organic resin and 29 represents the protective film, and the pixel part 12 and driving circuits 13 and 14 are covered by the organic resin 28, and the organic resin is covered by the protective film (AlNxOy film) 29. In addition, as the organic resin 28, it is preferable to use a transparent or half transparent material to visible light to the extent possible. Further, it is preferable that the organic resin 28 is a material which does not transmit impurities such as moisture and oxygen to the extent possible.

Moreover, the pixel part 12 and the driving circuits 13 and 14 are sealed by a covering member 30a by use of adhesive. The covering member 30a is adhered as a supporting body before peeling. In addition, in case that the peeling is carried out after the covering member 30a as the supporting body is adhered, there exist only insulating films 20 and 11 at a portion of a wiring lead-out terminal (connecting portion) and mechanical strength is weakened and therefore, before peeling, the FPC 19 is affixed and further, fixed by an organic resin 32.

Here, it is preferable that in order to resist against transformation due to heat or external force, as the covering member 30a, one which is the same material as the film substrate 10a, for example, a plastic substrate may be used. In addition, in order to block intrusion of impurities such as moisture and oxygen, an AlNxOy film 30b is formed in advance on the covering member 30a. Here, in order to transmit emitting light through the covering member, a barrier layer (AlNxOy film 30b) as a single layer was used, but in the same manner as in the film substrate 10a, a plurality of barrier layers and a layer (stress relaxation film) which is disposed between the barrier layers and has smaller stress than that of the barrier layer may be used. In that case, as a stress relaxation film, one that has high translucency is used.

In addition, 18 represents a wiring for transmitting signals to be inputted into the source side driving circuit 14 and the gate side driving circuit 13, and it receives a video signal and a clock signal from the FPC (flexible print circuit) 19 which becomes an external input terminal. In addition, here, only FPC is shown in the figure, but a printed wiring board (PWB) may be attached to this FPC. An EL module in the present specification is assumed to contain not only a main substrate on which a light emitting element is disposed but also a state in which FPC or PWB is attached thereto.

By sealing the light emitting element by the barrier films 10b and 10d represented by AlNxOy and the protective film 29 represented by AlNxOy by use of the above-described structure, the light emitting element can be completely blocked from an ambient air and it is possible to block intrusion of a material for inducing deterioration of which main cause is oxidization of the organic compound layer by moisture and oxygen from outside of the device. In addition, heat developed can be exhaled by AlNxOy film having a thermal conduction characteristic. Accordingly, it is possible to obtain a light emitting device which has high reliability.

In addition, by disposing a stress relaxation film between plural barrier films, obtained is a light emitting device which is not broken even when an external force is applied and flexible.

Figure 2:
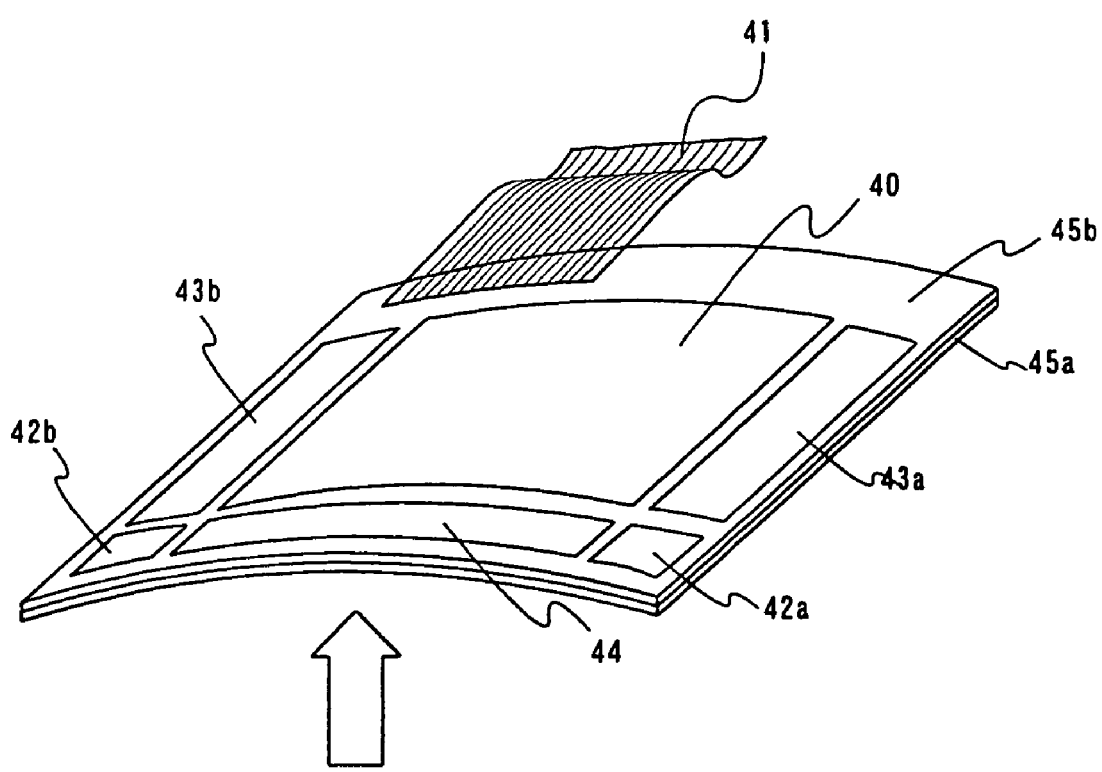
FIG. 2 is an outline view of the EL module when an external force is applied thereto.

Further, FIG. 2 shows an outline view of a flexible light emitting device 45 to which an external force is applied. In FIG. 2, 40 represents a pixel part, and 41 represents an FPC, and 42a and 42b represent integrated circuits, and 43a and 43b represent gate side driving circuits, and 44 represents a source side driving circuit, and 45a and 45b represent film substrates. A lamination layer of a layer which is represented by AlNxOy and a layer which comprises an organic resin is disposed on one side or both sides of film substrates 45a and 45b, and blocks intrusion of impurities such as moisture, oxygen and alkaline metal from outside to protect the light emitting element and TFT.

Further, in case that a lamination layer of the layer which is represented by AlNxOy and the layer which comprises the organic resin is disposed at an external side of the substrate, formed is a structure which has one or more of the layer which is represented by AlNxOy or the layer which comprises the organic resin, between the light emitting device and outside of the light emitting element, and impurity diffusion from outside of the light emitting element can be blocked. In the specification, outside means collectively elements and IC chips which are externally connected to the EL module and a package and other members which contact the EL module.

In addition, on the film substrate 45a, the pixel part 40, the driving circuit and the light emitting element are disposed and these elements are sandwiched together with the film substrate 45b. It is possible to form complex integrated circuits (such as a memory, a CPU, a controller and a D/A converter) 42a and 42b on the same substrate as that on which these pixel part and the driving circuit are formed, but it is difficult to manufacture it by use of small number of masks. Accordingly, it is preferable to carry out mounting one IC chip which has the memory, the CPU, the controller and the D/A converter by a COG (chip on glass) system, a TAB (tape automated bonding) system and a wire bonding method. It should be appreciated that the IC chip may be mounted after the film substrate 45a and the film substrate 45b are adhered, and the IC chip may be sealed by the film substrate 45b after the IC chip is mounted on the film substrate 45a.

In addition, here, only FPC is shown in the figure but a printed wiring board (PWB) may be attached to this FPC.

Further, it should be appreciated to form a structure in which the pixel electrode is made to be an anode, and the organic compound layer and the cathode are layered, and light is emitted in an opposite direction to FIG. 1. In that case, it is preferable to use the p-channel type TFT as the TFT for current control.

As to the invention which comprises the above-described structure, it will be described in more detail with reference to an embodiment shown below.

Embodiment 1

An embodiment of the present invention is described with reference to FIGS. 3A-3D and 4Aa-4D. Here, a method of simultaneously manufacturing a CMOS circuit in which n-channel TFT and p-channel TFT are complementarily combined is described in detail.

First, the first material layer 101, the second material layer 102, a base insulating film 103 are formed on a substrate 100 and a semiconductor film having a crystalline structure is obtained. Then, the semiconductor film is etched to have a desired shape to form semiconductor layers 104 and 105 separated from one another in an island shape.

A glass substrate (#1737) is used as the substrate 100.

For the first material layer 101, it has a characteristic of having a tensile stress within a range of 1 to $1 \times 10^{10}$ (Dyne/cm$^2$) after the filming process or directly before the peeling process. If materials using for the above-mentioned first material layer 101 having a tensile stress within the above-mentioned range, the material is not particularly limited to specific materials. A layer or lamination layer from the following material can be used for the first material layer 101; a metallic material (Ti, Al, Ta, W, Mo, Cu, Cr, Nd, Fe, Ni, Co, Zr, Zn, Ru, Rh, Pd, Os, Ir, and Pt, etc.), semiconductor materials (for instance, Si and Ge, etc.), insulating materials or organic materials. Especially, a tungsten film, a tungsten nitride film or a titanium nitride film is preferable. Note that, a film having a tensile stress with more than 1 to $1 \times 10^{10}$ (Dyne/cm$^2$) is easy to peel in case of applying the heat treatment. Here, titanium nitride film having film thickness of 100 nm laminated by a sputtering method is used. Note that, a buffer layer may be formed in the case that the first material layer 101 is poorly adhered to the substrate 100.

For the second material layer 102, it has a characteristic of having a compressive stress within a range of −1 to −1×10$^{10}$ (Dyne/cm$^2$). If materials using for the second material layer 102 have a compressive stress within the above-mentioned range, the material is not particularly limited. Any one layer or a lamination layer of the following material can be used for the second material layer 102; a metallic material (Ti, Al, Ta, W, Mo, Cu, Cr, Nd, Fe, Ni, Co, Zr, Zn, Ru, Rh, Pd, Os, Ir, and Pt, etc.), semiconductor materials (for instance, Si and Ge, etc.), insulating materials or organic materials. Especially, a single layer or a lamination layer composed of oxide silicon material or oxide metal material is preferable. Note that, a film having a compressive stress with more than −1×10$^{10}$ (Dyne/cm$^2$) is easy to peel in case of applying the heat treatment. A silicon oxide film having film thickness of 200 nm laminated by a sputtering method is used. The bonding force between the first material layer 101 and the second material layer 102 is strong against the heat treatment, so that the film peeling (also referred to as peeling) or the like does not occur. However, it can be easily peeled off on the inside of the second material layer or on the interface by the physical means.

For the base insulating film 103, a silicon oxynitride film formed from SiH$_4$, NH$_3$, and N$_2$O as material gases (composition ratio: Si=32%, O=27%, N=24%, H=17%) is formed with a thickness of 50 nm (preferably 10 to 200 nm) and at a film deposition temperature of 400° C. by using plasma CVD. Then, after the surface is cleaned with ozone water, an oxide film on the surface is removed by means of dilute hydrofluoric acid (dilution with 1/100). Next, a silicon oxynitride film formed from SiH$_4$ and N$_2$O as material gases (composition ratio: Si=32%, O=59%, N=7%, H=2%) is formed thereon with a thickness of 100 nm (preferably 50 to 200 nm) and at a film deposition temperature of 400° C. by using plasma CVD to thereby form a lamination. Further, without exposure to an atmosphere, a semiconductor film having an amorphous structure (in this case, amorphous silicon film) is formed to have a thickness of 54 nm (preferably 25 to 80 nm) with SiH$_4$ as a film deposition gas and at a film deposition temperature of 300° C. by using plasma CVD.

In this embodiment, the base film 103 is shown in a form of a two-layer structure, but a single layer of the above-mentioned insulating film or a structure in which two or more layers thereof are laminated may be adopted. Further, there is no limitation on the material of the semiconductor film. However, the semiconductor film may be preferably formed of silicon or silicon germanium (Si$_X$Ge1−X (X=0.0001 to 0.02)) alloy by using a known means (sputtering, LPCVD, plasma CVD or the like). Further, a plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface.

Then, a nickel acetate salt solution containing nickel of 10 ppm in weight is applied using a spinner. Instead of the application, a method of spraying nickel elements to the entire surface by sputtering may also be used.

Then, the heat treatment is conducted to perform crystallization, thereby forming a semiconductor film having a crystalline structure. The heat treatment using an electric furnace or irradiation of strong light may be conducted for this heat treatment. In case of the heat treatment using an electric furnace, it may be conducted at 500 to 650° C. for 4 to 24 hours. Here, after the heat treatment (500° C. for 1 hour) for dehydrogenation is conducted, the heat treatment (550° C. for 4 hours) for crystallization is conducted, thereby obtaining a silicon film having a crystalline structure. Note that, although crystallization is performed by using the heat treatment using a furnace, crystallization may be performed by means of a lamp annealing apparatus. Also note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by dilute hydrofluoric acid or the like, irradiation of first laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser or an YVO$_4$ laser is used for the laser light. Both the pulse oscillation and the continuous oscillitation are acceptable for the first laser. In case of applying the pulse oscillitation, that of a repetition frequency is set to approximately 10 to 1000 Hz, the pulse laser light is condensed to 100 to 500 mJ/cm$^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 mJ/cm$^2$. Note that an oxide film is formed on the surface by the first laser light irradiation since the irradiation is conducted in an atmosphere or in an oxygen atmosphere.

Next, after the oxide film formed by the first laser light irradiation is removed by dilute hydrofluoric acid, the second laser light irradiation is performed in a nitrogen atmosphere or in a vacuum, thereby the semiconductor film surface is leveled. Excimer laser light with a wavelength of 400 nm or less, or second harmonic wave or third harmonic wave of a YAG laser is used as the laser light (the second laser light). The energy density of the second laser light is made larger than that of the first laser light, preferably made larger by 30 to 60 mJ/cm$^2$. Here, the second laser light irradiation is performed with a repetition frequency of 30 Hz and energy density of 453 mJ/cm$^2$ to thereby set a P-V value (Peak to Valley, the difference between the maximum value and the minimum value in height) of unevenness in the semiconductor film surface to 50 nm or less. Here, the P-V value of unevenness may be obtained by AFM (atomic force microscope).

Further, although the second laser light irradiation is conducted over the surface in this embodiment, a step of selectively performing irradiation at least on a pixel portion may be adopted since the reduction of an off current particularly has an effect on a TFT of the pixel portion.

Next, the surface is processed with ozone water for 120 seconds, thereby forming a barrier layer comprised of an oxide film with a thickness of 1 to 5 nm in total. Then, an amorphous silicon film containing an argon element, which becomes a gettering site, is formed on the barrier layer to have a thickness of 150 nm by sputtering. The film deposition conditions with sputtering in this embodiment are: a film deposition pressure of 0.3 Pa; a gas (Ar) flow rate of 50 sccm; a film deposition power of 3 kW; and a substrate temperature of 150° C. Note that under the above conditions, the atomic concentration of the argon element contained in the amorphous silicon film is $3\times10^{20}/cm^3$ to $6\times10^{20}/cm^3$, and the atomic concentration of oxygen is $1\times10^{19}/cm^3$ to $3\times10^{19}/cm^3$. Thereafter, the heat treatment at 650° C. for 3 minutes is conducted using the lamp annealing apparatus to perform gettering.

Subsequently, the amorphous silicon film containing the argon element, which is the gettering site, is selectively removed with the barrier layer as an etching stopper, and then, the barrier layer is selectively removed by dilute hydrofluoric acid. Note that there is a tendency that nickel is likely to move to a region with a high oxygen concentration in gettering, and thus, it is preferable that the barrier layer comprised of the oxide film is removed after gettering. Although, the example of performing the gettering is shown here, there is no particular limitation and other gettering method can be used.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 104 and 105 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 106, is formed. In this embodiment, a silicon oxynitride film (composition ratio: Si=32%, O=59%, N=7%, H=2%) is formed with a thickness of 115 nm by plasma CVD.

Figure 3A:
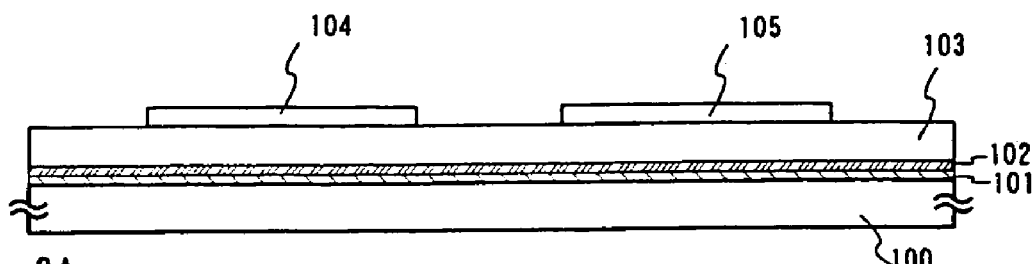
FIGS. 3A to 3D are views which show a manufacturing process of TFT.
Figure 3B:
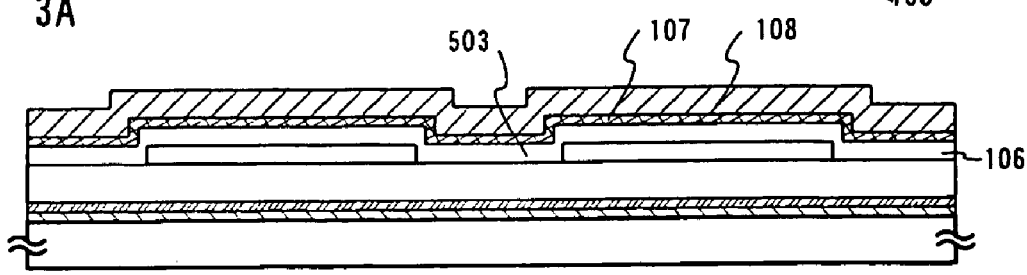

Next, as shown in FIG. 3B, on the gate insulating film 106, a first conductive film 107 with a thickness of 20 to 100 nm and a second conductive film 108 with a thickness of 100 to 400 nm are formed in lamination. In this embodiment, a 50 nm thick tantalum nitride film and a 370 nm thick tungsten film are sequentially laminated on the gate insulating film 106.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Figure 3C:
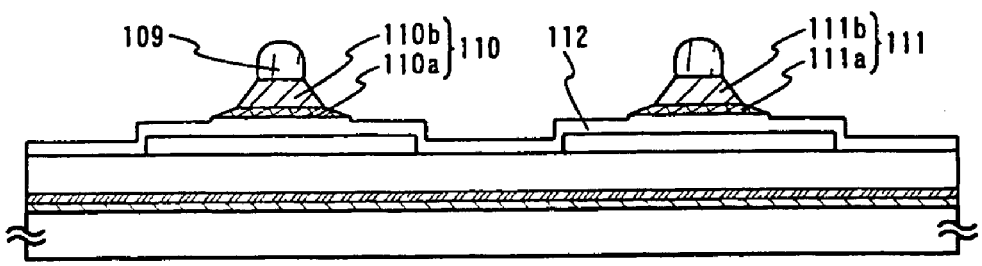

Next, as shown in FIG. 3C, masks 109 is formed by a light exposure step, and a first etching process for forming gate electrodes and wirings is performed. An ICP (Inductively Coupled Plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by $Cl_2$, $BCl_3$, $SiCl_4$, $CCl_4$ or the like, fluorine-based gases typified by $CF_4$, $SF_6$, $NF_3$, or the like and $O_2$ can be appropriately used as etching gases. In the first etching process, the edges of the films can be tapered owing to the shape of the resist mask and the effect of the bias voltage applied to the substrate side. The angle of the tapered portion is set to 15 to 45°. In order to etch the films without leaving any residue on the gate insulating film, the etching time is prolonged by about 10 to 20%. The selective ratio of the silicon oxynitride film to the W film is 2 to 4 (typically, 3), and hence the exposed surface of the silicon oxynitride film is etched by about 20 to 50 nm through the over-etching treatment. Through the first etching treatment, the first shape conductive layers 110 and 111 (first conductive layers 110a and 111a and second conductive layers 110b and 111b) are formed from the first conductive film and the second conductive film. Denoted by 112 is a gate insulating film and a region of the gate insulating film which is not covered with the first shape conductive layers is etched and thinned by about 20 to 50 nm.

Figure 3D:
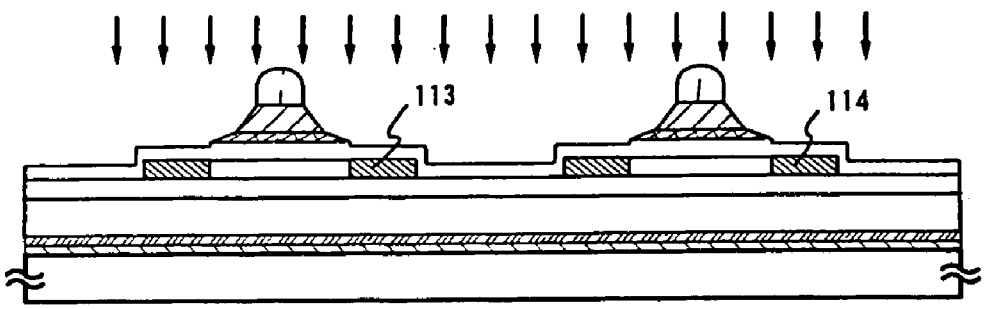

Then the first doping treatment is performed to dope the film with an n-type impurity (donor) (FIG. 3D). The doping is made by ion doping or ion implantation. In ion doping, the dose is set to $1\times10^{13}$ to $5\times10^{14}$ atoms/$cm_2$. Used as the impurity element for imparting the n-type conductivity is a Group 15 element, typically phosphorus (P) or arsenic (As). In this case, the first shape conductive layers 110 and 111 serve as masks against the element used for the doping and the acceleration voltage is adjusted appropriately (20 to 60 keV, for example). The impurity element thus passes through the gate insulating film 112 to form impurity regions (n+ region) 113 and 114. For example, the phosphorus (P) concentration in the impurity regions (n+ region) is set to $1\times10^{20}$ to $1\times10^{21}/cm^3$.

Figure 4A:
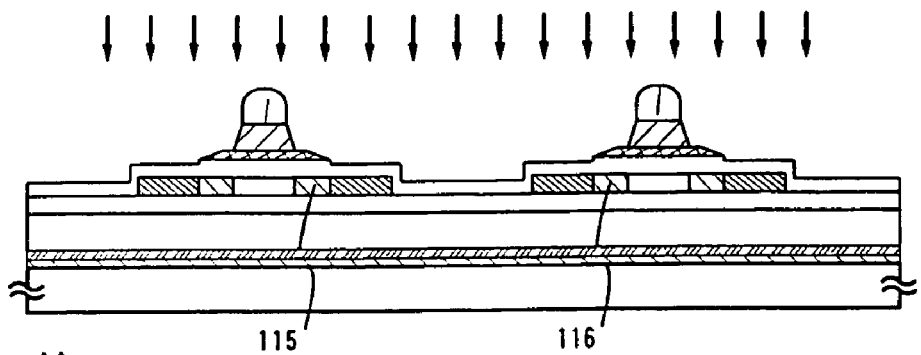
FIGS. 4A to 4D are views which show a manufacturing process of TFT.

Then, the second doping treatment is carried out as shown in FIG. 4A. The film is doped with an n-type impurity (donor) in a dose smaller than in the first doping treatment at a high acceleration voltage. For example, the acceleration voltage is set to 70 to 120 keV and the dose is set to $1\times10^{13}/cm^2$. As a result, impurity regions are formed inside the first impurity regions that have been formed in the semiconductor layer in FIG. 3D. In the second doping treatment, the second conductive films 110b and 111b are used as masks against the impurity element and the impurity element reaches regions below the first conductive films 110a and 111a. Thus formed are impurity regions (n– region) 115 and 116 that overlap the first conductive films 110a and 111a, respectively. Since the remaining first conductive layers 110a and 111a have almost the uniform thickness, the concentration difference along the first conductive layers is small and the concentration in the impurity regions is $1\times10^{17}$ to $1\times10^{19}/cm^3$.

Figure 4B:
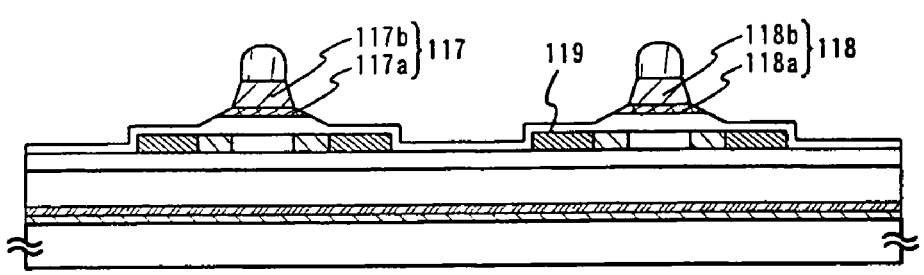

The second etching treatment is then conducted as shown in FIG. 4B. In this etching treatment, ICP etching is employed, $CF_4$, $Cl_2$ and $O_2$ are mixed as etching gas, and plasma is generated by giving RF (13.56 MHz) power of 500 W to a coiled electrode at a pressure of 1 Pa. RF (13.56 MHz) power of 50 W is also given to the substrate side (sample stage) so that a self-bias voltage lower than that of the first etching treatment can be applied. The tungsten film is subjected to anisotropic etching under these conditions so that the tantalum nitride film or the titanium film serving as the first conductive layers is remained. In this way, second shape conductive layers 117 and 118 (first conductive films 117a and 118a and second conductive films 117b and 118b) are formed. Denoted by 119 is a gate insulating film and a region of the gate insulating film which is not covered with the second shape conductive layers 117 and 118 is further etched and thinned by about 20 to 50 nm.

Figure 4C:
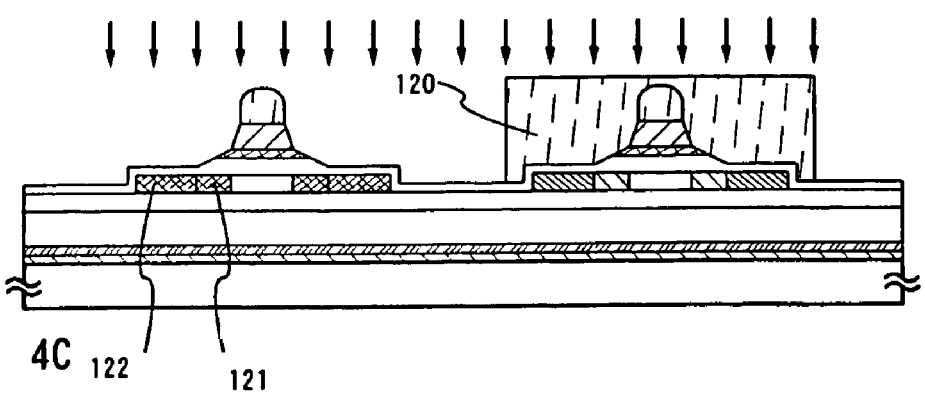

Then, a resist mask 120 is formed as shown in FIG. 4C, and a p-type impurity (acceptor) is doped with the semiconductor layer that forms the p-channel TFT. Typically, boron (B) is used. The impurity concentration in impurity regions (p+ region) 121 and 122 is set within the range of $2\times10^{20}$ to $2\times10^{21}/cm^3$. In addition, the impurity regions are doped with boron one and a half times as much as phosphorus concentration contained in the impurity regions, thereby, the conductive type is inverted.

Figure 4D:
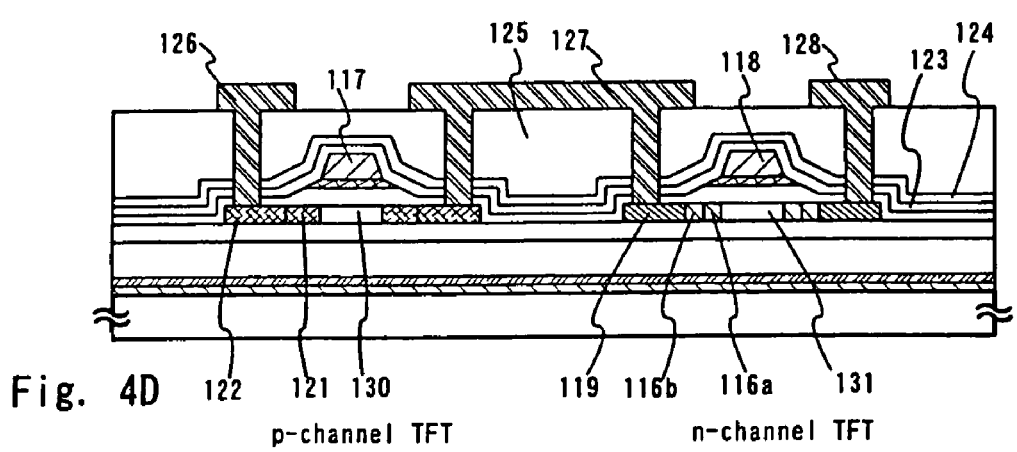

The impurity regions are formed in each semiconductor layer through the above steps. The second shape conductive layers 117 and 118 serve as gate electrodes. Thereafter, as shown in FIG. 4D, a protective insulating film 123 is formed of a silicon nitride film or a silicon oxynitride film by plasma CVD. The impurity elements that are doped the semiconductor layers are then activated for controlling the conductivity type. A silicon nitride film 124 is formed and subjected to hydrogenation. Hydrogen is released from the silicon nitride film 124 as a result and hydrogen diffuses to the semiconductor layers. The semiconductor layers are thus hydrogenated.

An interlayer insulating film 125 is formed of an organic insulating material such as polyimide, acrylic and the like. A silicon oxide film formed by plasma CVD using TEOS (Tetraethyl Ortho silicate) may of course be adopted instead, but it is preferable to choose the above organic insulating material from the viewpoint of improving levelness.

Contact holes are formed next, so that source or drain wirings 126 to 128 are formed from aluminum (Al), titanium (Ti), tantalum (Ta) or the like.

In accordance with the above processes, a CMOS circuit obtained by combining an n-channel TFT and a p-channel TFT complementally is obtained. A p-channel TFT has a channel formation region 130, and has the impurity regions 121 and 122 that function as source regions or drain regions.

An n-channel TFT has a channel formation region 131; an impurity region 116a (Gate Overlapped Drain: GOLD region) overlapping the gate electrode 118 that is formed of the second shape conductive layer; an impurity region 116b (LDD region) formed outside the gate electrode; and an impurity region 119 functioning as a source region or a drain region.

The CMOS TFT as such can be used to form a part of a driver circuit of an active matrix light emitting device or an active matrix liquid crystal display device. Besides, the n-channel TFT or the p-channel TFT as above can be applied to a transistor for forming a pixel portion.

By combining the CMOS circuits of this embodiment, a basic logic circuit, and further, a complicated logic circuit (such as a signal divider circuit, a D/A converter, an operation amplifier, a γ correction circuit and the like) can be formed. It also can manufacture a memory or a microprocessor.

Embodiment 2

An example of fabrication of a light emitting device having a light emitting element and using the TFTs obtained in accordance with above Embodiment 1 will be described with reference to FIG. 5.

Figure 5:
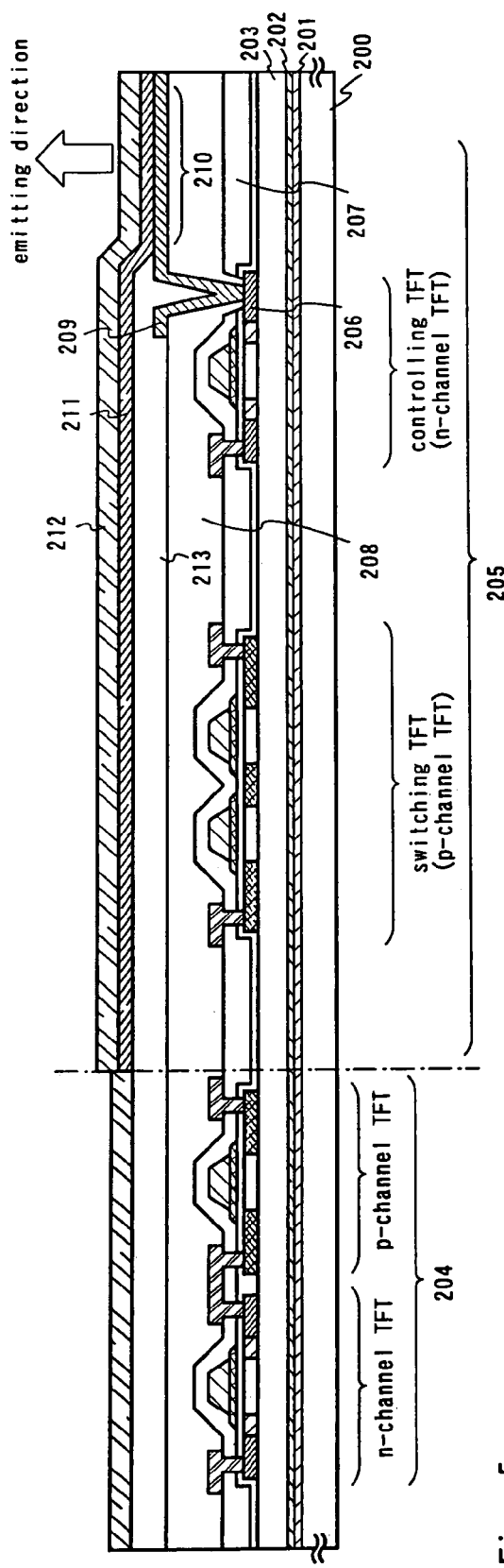
FIG. 5 is a sectional view of an active matrix substrate on which a light emitting element is disposed.

FIG. 5 shows an example of a light emitting device (in a state before sealing) having a pixel portion and a drive circuit for driving the pixel portion, the pixel portion and the drive circuit being formed on one insulating member. A CMOS circuit forming a basic unit in the drive circuit and one pixel in the pixel portion are illustrated. The CMOS circuit can be obtained in accordance with Embodiment 1.

Referring to FIG. 5, a substrate 200, the first material layer 201 and the second material layer 202 are provided. On a base insulating layer 203 formed on the element formation substrate, the drive circuit 204 constituted of an n-channel TFT and a p-channel TFT, a switching TFT, which is a p-channel TFT, and a current control TFT, which is an n-channel TFT, are formed. In this embodiment, each of the TFTs is formed as a top gate TFT.

The n-channel TFT and the p-channel TFT are the same as those in Embodiment 1. The description for them will not be repeated. The switching TFT is a p-channel TFT of a structure having two channels forming regions between a source region and a drain region (double-gate structure). In this embodiment, the structure of the switching TFT is not limited to the double-gate structure, and the switching TFT may alternatively have a single-gate structure in which only one channel forming region is formed or a triple-gate structure in which three channel forming regions are formed.

A contact hole is formed in a first interlayer insulating film 207 above the drain region 206 of the current control TFT before a second interlayer insulating film 208 is formed. This is for the purpose of simplifying the etching step when a contact hole is formed in the second interlayer insulating film 208. A contact hole is formed in the second interlayer insulating film 208 so as to reach the drain region 206, and a pixel electrode 209 connected to the drain region 206 is formed in the contact hole. The pixel electrode 209 functions as the cathode of the light emitting element and is formed by using a conductive film containing an element belonging to the group I or II in the periodic table. In this embodiment, a conductive film of a compound composed of lithium and aluminum is used.

An insulating film 213 is formed so as to cover an end portion of the pixel electrode 209. The insulating film 213 will be referred to as a bank in this specification. The bank 213 may be formed of an insulating film containing silicon or a resin film. If a resin film is used, carbon particles or metal particles may be added to set the specific resistance of the resin film to $1\times10^6$ to $1\times10^{12}$ Ωm (preferably $1\times10^8$ to $1\times10^{10}$ Ωm), thereby reducing the possibility of dielectric breakdown at the time of film forming.

The light emitting element 210 is formed by the pixel electrode (cathode) 209, an organic compound layer 211, and an anode 212. As the anode 212, a conductive film of a large work function, typically an oxide conductive film is used. As this oxide conductive film, indium oxide, tin oxide, zinc oxide or some other compound of these elements may be used.

In this specification, organic compound layer is defined as a generic name to a lamination layer formed by combining with a light emitting layer, a hole injection layer, a hole transporting layer, a hole blocking layer, an electron transporting layer, an electron injection layer, or an electron blocking layer. However, the organic compound layer may comprise a single layer of organic compound film.

The material of the light emitting layer is an organic compound material but not limited to a particular one. It may be a high-molecular weight material or a low-molecular weight material. For example, a thin film formed of a light emitting material capable of emitting light by doublet excitation or a thin film formed of a light emitting material capable of emitting light by triplet excitation may be used as the light emitting layer.

It is effective to form a passivation film (not shown) so as to completely cover the light emitting element 210 after the formation of the anode 212. A film having thermal conductivity, for example, a layer shown by $AlN_xO_y$, is suitably used as the passivation film. Also, an insulating film comprising a DLC film, a silicon nitride film or a silicon oxynitride film, or a lamination layer formed of a combination of such films may be used as the passivation film.

After the sealing (enclosure) process is conducted to protect light emitting element 210 by sealing thereof with cover materials, which is to be a support, as shown in Embodiment Mode, and then, a substrate 200 provided the first materials layer 201 is peeled off. The second material layer and a film substrate are bonded together with a bond layer. Plural barrier films are provided on the film substrate. A layer that has a smaller stress (a stress relaxation film) than that of the barrier films is provided between the barrier films. The state that the second material layer and a film substrate are bonded together is shown in FIGS. 1A and 1B of Embodiment Mode. The second material layer is corresponded to the insulating film 11.

Embodiment 3

Here is shown an embodiment which is different from the process shown in the embodiment 2, and concretely, a peeling process and a bonding process will be described in detail with reference to FIGS. 6A to 6C and 7A and 7B.

Figures 6A, 6B, 6C:
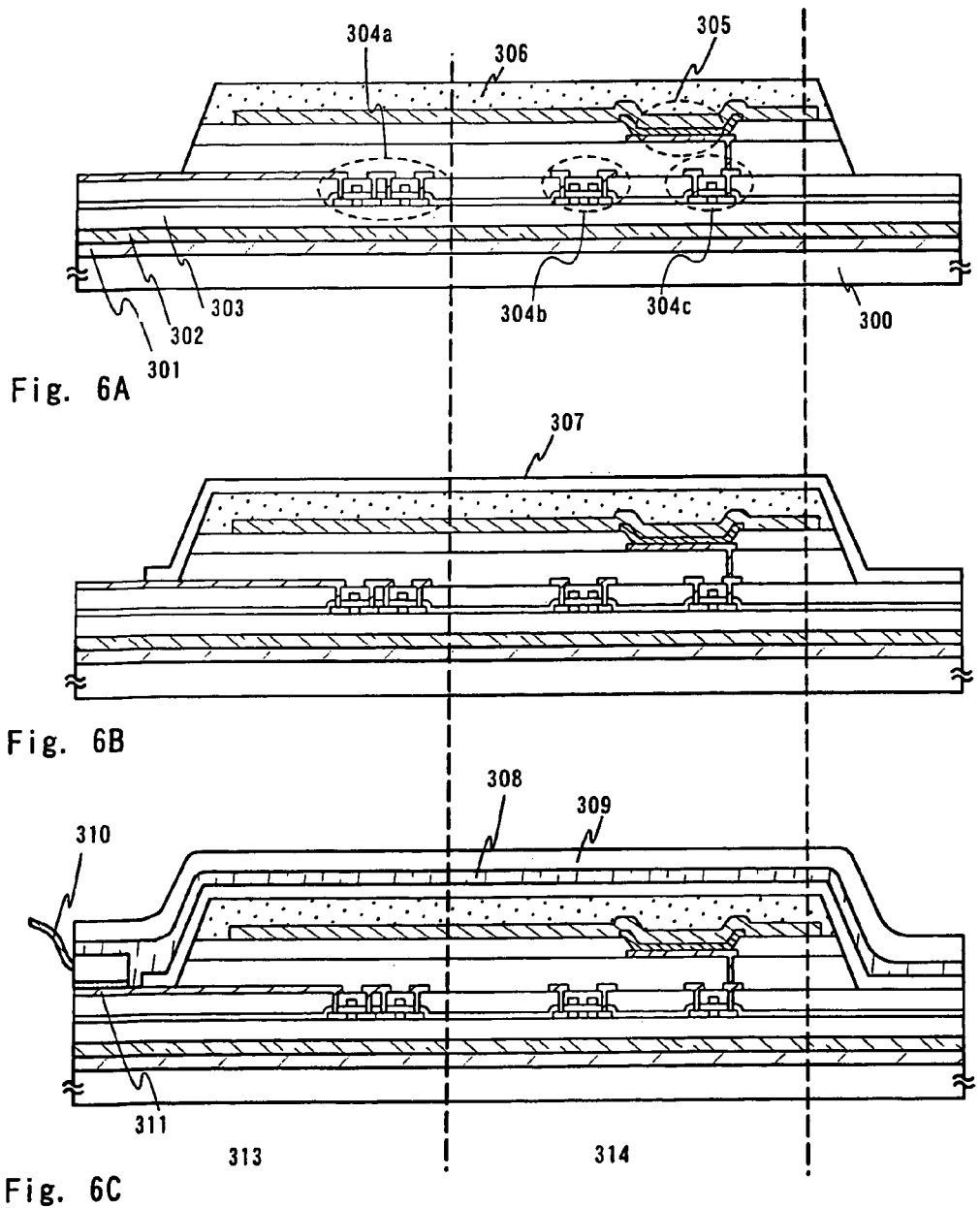
FIGS. 6A to 6C are process sectional views for explaining an embodiment 3.

In FIG. 6A, 300 represents a substrate, and 301 represents a nitride layer, and 302 represents an oxide layer, and 303 represents a furring insulating layer, and 304a-304c represent TFTs, and 305 represents a light emitting element, and 306 represents an interlayer insulating film.

In FIG. 6A, as the substrate 300, a glass substrate, a quartz substrate and a ceramic substrate can be used. Further, a silicon substrate, a metal substrate or a stainless steel substrate may be used.

Firstly, as shown in FIG. 6A, in accordance with the preferred embodiment, on the substrate 300, a first material layer 301 and a second material layer 302 are formed. It is important to differ film stress of this first material layer 301 from film stress of the second material layer 302. Each film thickness may be set at pleasure to be within a range of 1 nm to 1000 nm and each film stress may be adjusted.

Then, on the second material layer 302, a layer to be peeled off is formed. The layer to be peeled off may be a layer which contains various elements as represented by TFT (a thin film diode, a photoelectric conversion element having a PIN bonding with silicon and a silicon resistance element). Further, thermal processing can be carried out within a range that the substrate 300 can resist. In addition, in the invention, even when film stress of the second material layer 302 is different from film stress of the first material layer 301, peeling does not occur by thermal processing in a process for forming the layer to be peeled off. Here, as the layer to be peeled off, on the base insulating layer 303, an element 304a of the driving circuit 313 and elements 304b and 304c of the pixel part 314 are formed, and a light emitting element 305 for electrically connecting to the element 304c of the pixel part 304 is formed, and in order to cover the light emitting element, an interlayer insulating film (organic resin having translucency) 306 with film thickness of 10 nm to 1000 nm is formed (FIG. 6A).

Further, in case that unevenness is made on a surface by the first material layer 301 and the second material layer 302, the surface may be planarized before and after the base insulating layer is formed. Coverage is made to be better in the layer to be peeled off in case that planarization is carried out, and in case that the layer to be peeled off containing an element is formed, element characteristic is apt to be stabilized and therefore, it is preferable. In addition, as this planarization processing, an etch-back method for planarizing by carrying out an etching after a coating film (a resist film) is formed and a mechanical chemical polishing method (a CMP method) may be used.

Then, on the interlayer insulating film 306, formed is a nitride oxide film 307 which is represented by an AlNxOy film with thickness of 10 nm to 1000 nm and contains aluminum (FIG. 6B). This AlNxOy film 307 functions as a protective film. Here, by use of an aluminum nitride (AlN) target, film forming is carried out under an atmosphere in which argon gas (20 sccm), nitrogen gas (15 sccm) and oxygen gas (5 sccm) are mixed. Further, by use of an aluminum (Al) target, film forming may be carried out under an atmosphere which contains the nitrogen gas and the oxygen gas. Furthermore, the AlNxOy film 307 has also an advantage for blocking intrusion of a material which expedites deterioration of light emitting element 305, something like impurities such as moisture and oxygen from outside of the device.

Then, an FPC 310 and an IC chip (not shown in the figure) are attached by a COG (chip on glass) system, a TAB (tape automated bonding) system and a wire bonding method. Further, each wiring of each TFT and an input/output terminal 311 are coupled by a wiring (connecting wiring), and the FPC 310 is adhered to the input/output terminal 311 by an anisotropic conductive member. The anisotropic conductive member comprises a resin and a conductive particle with diameter of several dozen to several hundred μm on which surface, Au is plated, and the input/output terminal and the wiring formed on the FPC are electrically connected by the conductive particle. An IC chip which has a memory, a CPU, a controller and a D/A converter is adhered to the substrate in the same manner by the anisotropic conductive member, and by the conductive particle which is mixed in the resin, the input/output terminal disposed in the IC chip and a leader line or a connecting wiring and the input/output terminal are electrically connected.

Then, a supporting body (a covering member which comprises a plastic substrate) 309 for fixing the layer to be peeled off to peel the substrate 300 by a physical means is attached by an adhesive layer 308 such as epoxy resin (FIG. 6C). Here is shown an example on the assumption that mechanical strength of the layer to be peeled off is insufficient, but in case that mechanical strength of the layer to be peeled off is sufficient, it is possible to carry out the peeling without the supporting body for fixing the layer to be peeled off. Since the supporting body 309 is attached to cover the FPC 310 and the IC chip, connection of the input/output terminal 311 and the FPC is more strengthened by adhesion of the supporting body 309. Further, here was shown the example in which the supporting body is adhered after the FPC and the IC chip were adhered, but the FPC and the IC chip may be mounted after the supporting body is adhered.

Figure 7A:
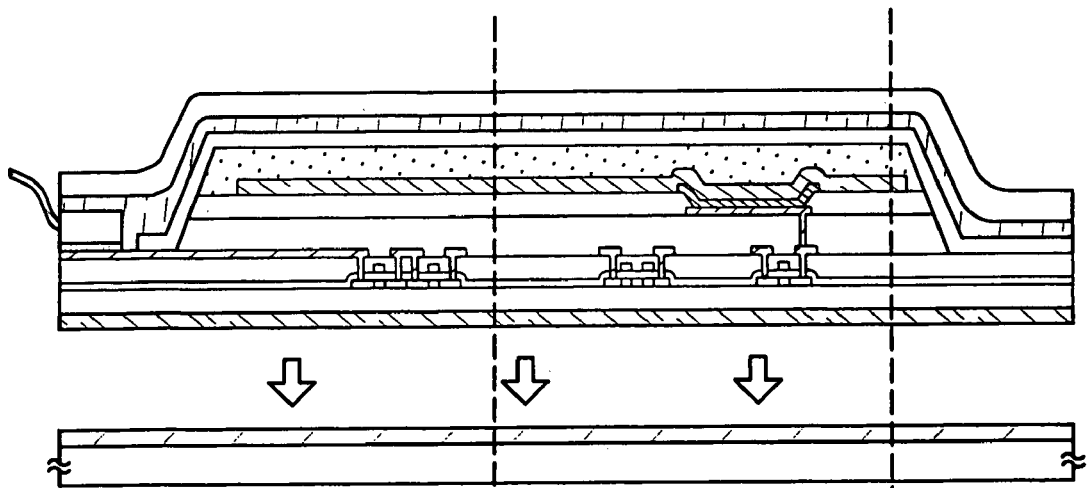
FIGS. 7A and 7B are process sectional views for explaining the embodiment 3.
Figure 7B:
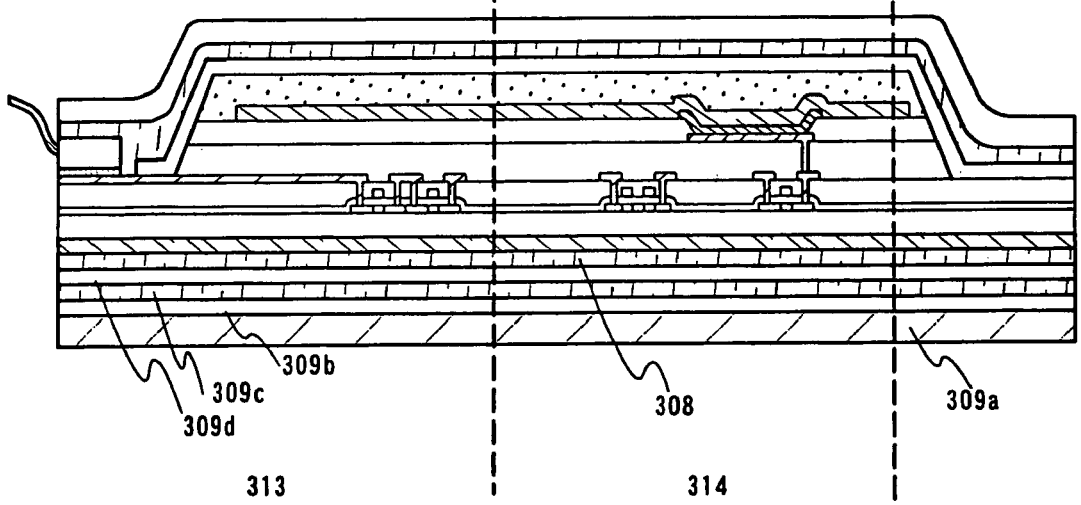

Then, the substrate 300 on which the first material layer 301 is formed is peeled off by the physical means. Since film stress of the second material layer 302 is different from film stress of the first material layer 301, it is possible to peel off by relatively small force. A bonding force of the first material layer 301 and the second material layer 302 has strength which can resist against thermal energy and, since respective film stresses are different and stress distortion exists between the first material layer 301 and the second material layer 302, it is weak to mechanical energy, and it is optimum to peel off. Thus, the layer to be peeled off which is formed on the second material layer 302 can be peeled off from the substrate 300. FIG. 7A shows a state after the peeling. In addition, this method of peeling is applied to the peeling of the layer to be peeled off having a small area, and besides, it is possible to peel off in all surfaces of the layer to be peeled off having a large area with good yield ratio.

Then, the second material layer 302 is attached to a transferring body 309a by the adhesive layer 308 such as epoxy resin. In the preferred embodiment, shown was an example which has the air gap between the covering member and the protective film, but in this embodiment, shown is an example in which the adhesive layer is adhered to the protective film 307.

Further, here, weight saving is carried out by use of a plastic film substrate as the transferring body 309a. Furthermore, by disposing a lamination layer of a layer which functions as a barrier film and is represented by AlNxOy (called as AlNxOy film) 309b and a stress relaxation film (organic resin) 309c and an AlNxOy film 309d on the transferring body 309a, the barrier film effectively prevents intrusion of impurities such as moisture and oxygen in a light emitting layer and a penetration of impurities such as moisture and oxygen into a light emitting layer is prevented effectively by the barrier film. At the same time, a light emitting device having more flexibility can be obtained by providing a stress relaxing film between a plurality of barrier film, and an occurrence of crack can be prevented.

Thus, a light emitting device comprising a light emitting element formed on a plastic substrate having flexibility is completed.

In this specification, the transferring body is bonded to the layer to be peeled off after the peeling. The transferring body is not limited to a material having any composition, for example, plastic, glass, metal ceramic or the like can be used as the transferring body. Also, in this specification, the supporting body is bonded to the layer to be peeled off when it is peeled off by a physical means supporting body, and is not limited to the material having any composition, for example, plastic, glass, metal ceramic or the like can be used as the supporting body. The shape of the transferring body and the supporting body is not limited, the shape may be a plane or a film and have a curved surface. If the lightening is prioritized, a film plastic substrate is preferable as follows, for example, polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide or the like.

Embodiment 4

Figure 8:
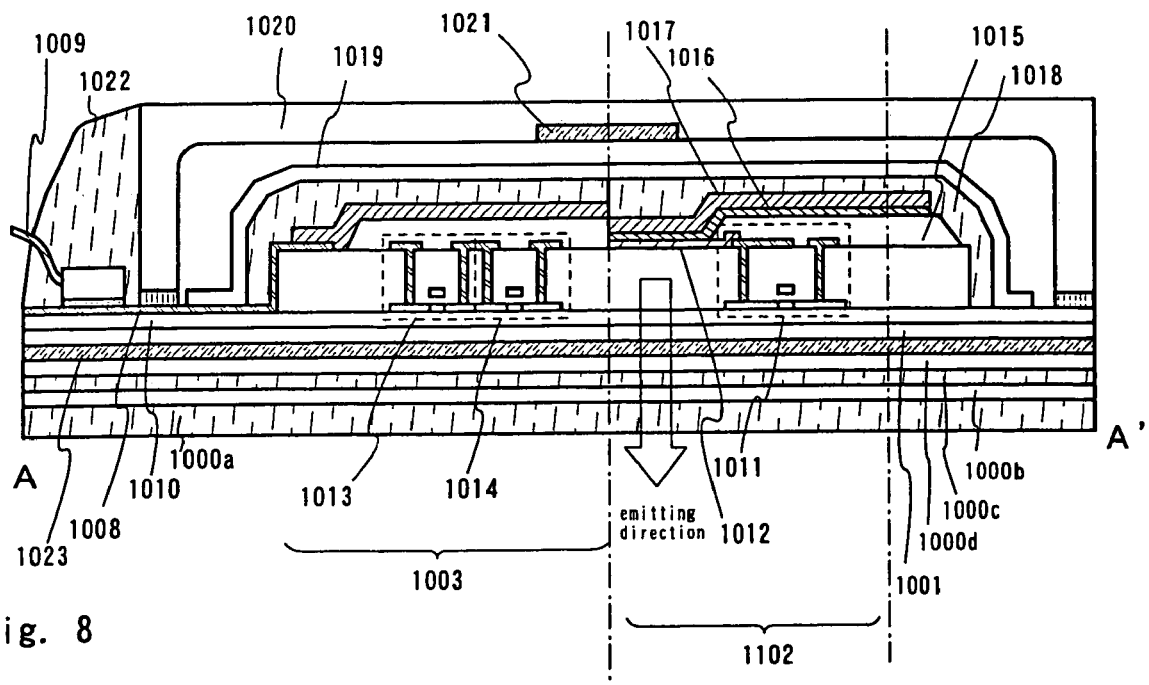
FIG. 8 is a sectional view of an EL module for explaining an embodiment 4.

In this embodiment, a pixel electrode is used as an anode and an organic compound layer and a cathode are laminated to emit light in a direction opposite to the direction indicated in the Embodiment mode (FIG. 1B). FIG. 8 shows an example of such a structure. The top view is not illustrated because it is same as FIG. 1A.

The cross-sectional structure shown in FIG. 8 is described. The film substrate 1000a provided with the lamination layer composed of the AlNxOy film 1000b and the stress relaxation film 1000c is bonded to the insulating film 1001 with a bonding layer 1023. The insulating film 1010 is formed on the insulating film 1001. The pixel portion 1002 and the gate driving circuit 1003 are formed above the insulating film 1010. The pixel portion 1002 is composed of the current control TFT 1011 and plural pixels including the pixel electrode 1012 that is connected electrically to the drain of the current control TFT 1011. The current control TFT 1011 is possible to use an n-channel TFT, however, it is prefer to use a p-channel TFT. In addition, the gate driving circuit 1003 is formed by using a CMOS circuit that is combined with the n-channel TFT 1013 and the p-channel TFT 1014.

These TFTs (included 1011, 1013, 1014) may be fabricated in the same manner as an n-channel TFT and a p-channel TFT in Embodiment 1.

The pixel electrode 1012 functions as an anode of the light emitting element. Banks 1015 are formed at opposite ends of the pixel electrode 1012, and an organic compound layer 1016 and a cathode 1017 of the light emitting element are formed over the pixel electrode 1012.

The cathode 1017 also functions as a common wiring element connected to all the pixels and is electrically connected to a FPC 1009 via connection wiring 1008. All the elements included in the pixel portion 1002 and the gate driving circuit 1003 are covered with the cathode 1017, an organic resin 1018 and a protective film 1019. It is possible to apply the AlNxOy film the same as the AlNxOy film 1000b as the protective film 1019 and it is bonded by a cover member 1020 and a bonding layer. A recess portion is formed in the cover member and a desiccant 1021 is set therein.

In the case where the cover member 1020 is formed so as to have a cavity as shown in FIG. 8, a portion corresponding to the wiring lead-out terminal is only the insulating film 1010 at the time of peeling-off after bonding of the cover member 1020 provided as the supporting member, and then the mechanical strength of this portion is low. Therefore, it is desirable that the FPC 1009 be attached before peeling-off and fixed by an organic resin 1022.

In the FIG. 8, the pixel electrode is used as the anode while the organic compound layer and the cathode are laminated, so that light is emitted in the direction of the arrow in FIG. 8.

While the top gate TFTs have been described as an example, the present invention can be applied irrespective of the TFT structure. For example, the present invention can be applied to bottom gate (inverted staggered structure) TFTs and staggered structure TFTs.

Embodiment 5

While an example of using the top gate TFT in Embodiment Mode has been described, a bottom gate TFT can also be used. An example of using a bottom gate TFT will be described with reference to FIG. 9.

Figure 9:
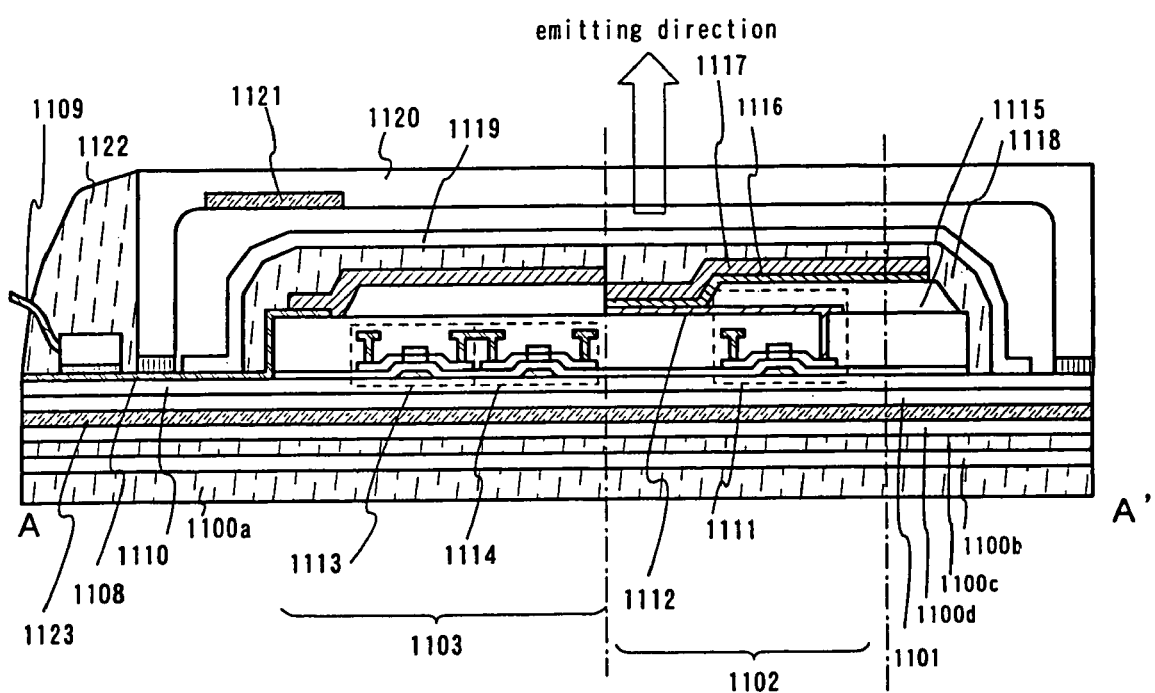
FIG. 9 is a sectional view of an EL module for explaining an embodiment 5.

As shown in FIG. 9, each of an n-channel TFT 1113, a p-channel TFT 1114, and an n-channel TFT 1111 are having the bottom gate structure. The bottom gate structures may be fabricated by using known techniques. The active layer of these TFTs may be a semiconductor film having a crystalline structure (polysilicon and the like) or a semiconductor film having an amorphous structure (amorphous silicon and the like).

In FIG. 9 is illustrated a flexible film substrate 1100a (e.g., a plastic substrate), an AlNxOy film 1100b, an AlNxOy film 1100d, a stress easing film (organic resin) 1100c, an insulating film as the second material layer (e.g. a silicon oxide film), a pixel portion 1102, a gate driving circuit 1103, an insulating film 1110, a pixel electrode (cathode) 1112, a bank 1115, an organic compound layer 1116, an anode 1117, an organic resin 1118, a protective film (AlNxOy film) 1119, a cover member 1120, a desiccant 1121, an organic resin 1122, and a bonding layer 1123.

The structure is the same as that of Embodiment Mode except for the n-channel TFT 1113, the p-channel TFT 1114 and the n-channel TFT 1111. Therefore, a description thereof is omitted here.

Embodiment 6

The EL module formed by implementing the present invention can be used in various display portions of electronic apparatuses. That is, the present invention can be implemented in all of electronic apparatus integrated with the EL modules at display portions thereof.

As such electronic apparatus, there are pointed out a video camera, a digital camera, a head mount display (goggle type display), a car navigation system, a projector, a car stereo, a personal computer, a portable information terminal (mobile computer, portable telephone or electronic book) and the like. Examples of these are shown in FIGS. 10A to 10F, 11A to 11C.

Figures 10A, 10B:
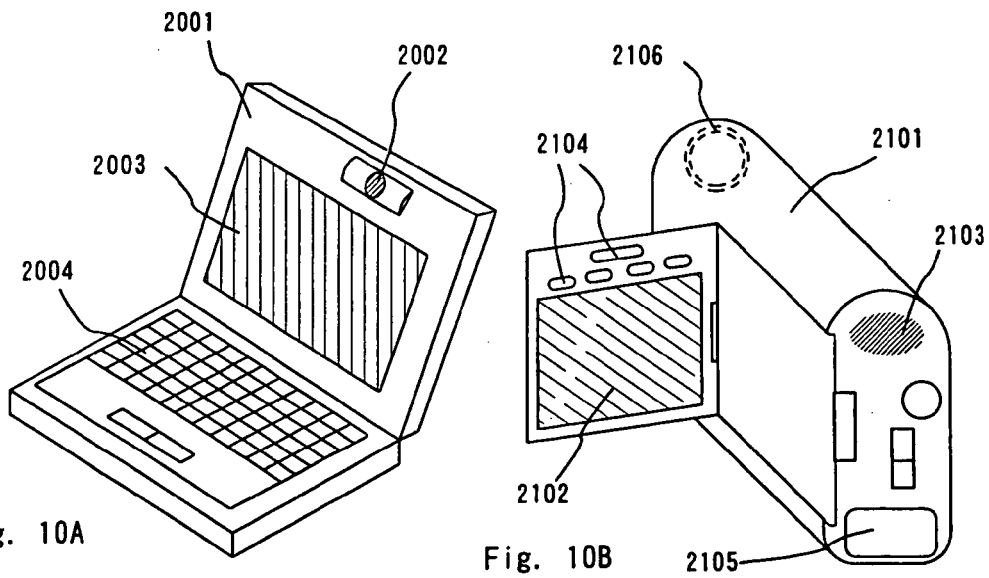
FIGS. 10A to 10F are views which show one embodiment of an electronic apparatus.

FIG. 10A shows a personal computer including a main body 2001, an image input portion 2002, a display portion 2003, a keyboard 2004 and the like. The present invention can be applied to the display portion 2003.

FIG. 10B shows a video camera including a main body 2101, a display portion 2102, a voice input portion 2103, operation switches 2104, a battery 2105, an image receiving portion 2106 and the like. The present invention can be applied to the display portion 2102.

Figures 10C, 10D:
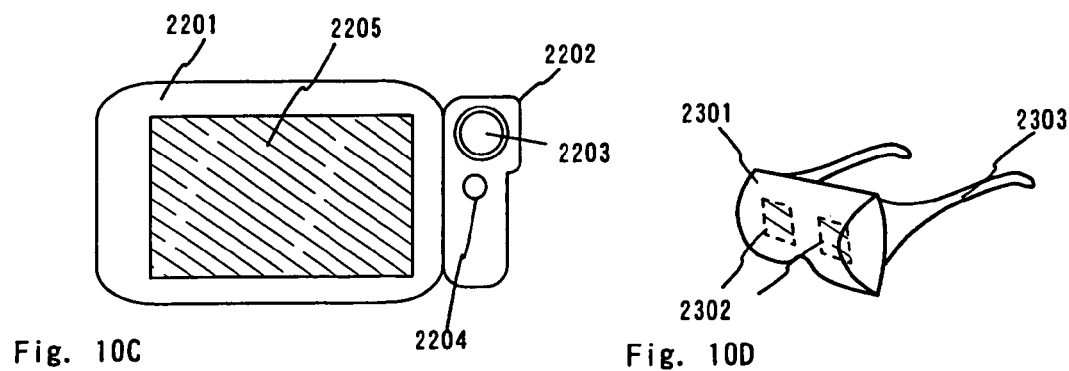

FIG. 10C shows a mobile computer including a main body 2201, a camera portion 2202, an image receiving portion 2203, an operation switch 2204, a display portion 2205 and the like. The present invention can be applied to the display portion 2205.

FIG. 10D shows a goggle type display including a main body 2301, a display portion 2302, an arm portion 2303 and the like. The present invention can be applied to the display portion 2302.

Figures 10E, 10F:
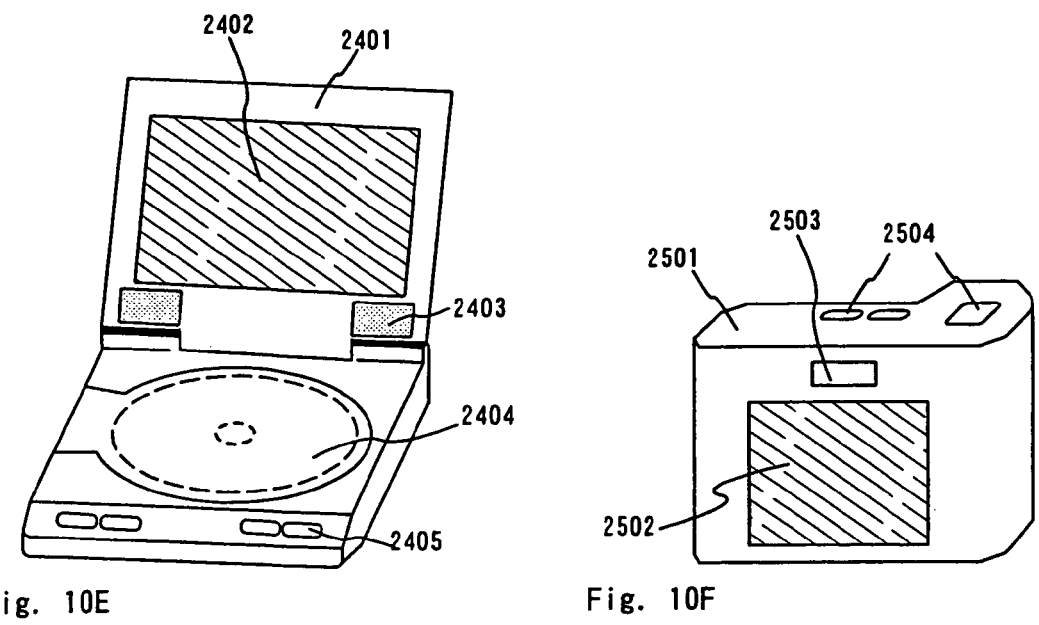

FIG. 10E shows a player using a record medium recorded with programs (hereinafter, referred to as record medium) including a main body 2401, a display portion 2402, a speaker portion 2403, a record medium 2404, an operation switch 2405 and the like. The player uses DVD (Digital Versatile Disc), CD and the like as the record medium and can enjoy music, enjoy movie and carry out games or Internet. The present invention can be applied to the display portion 2402.

FIG. 10F shows a digital camera including a main body 2501, a display portion 2502, an eye contact portion 2503, operation switches 2504, an image receiving portion (not illustrated) and the like. The present invention can be applied to the display portion 2502.

Figure 11A:
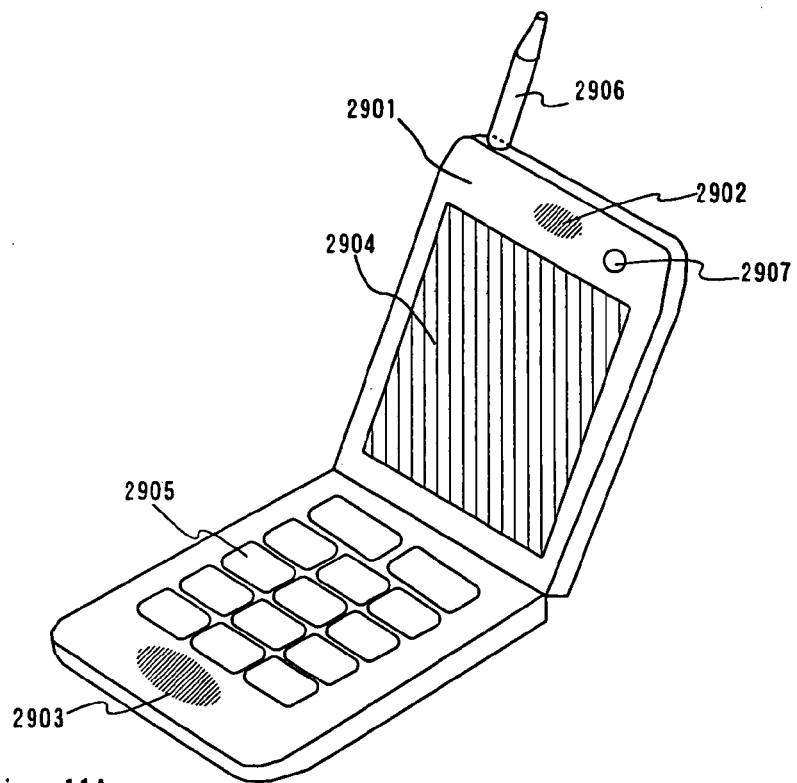
FIGS. 11A to 11C are views which show one embodiment of the electronic apparatus.

FIG. 11A shows a portable telephone including a main body 2901, a sound output portion 2902, a sound input portion 2903, a display portion 2904, an operation switch 2905, an antenna 2906, an image input portion (CCD, image sensor or the like) 2907 and the like. The present invention can be applied to display portion 2904.

Figure 11B:
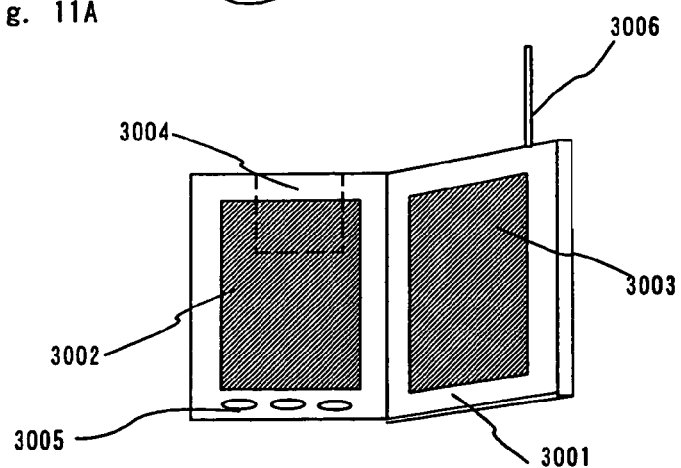

FIG. 11B shows a portable book (electronic book) including a main body 3001, display portion 3002, 3003, a record medium 3004, an operation switch 3005, an antenna 3006 and the like. The present invention can be applied to display portions 3002 and 3003.

Figure 11C:
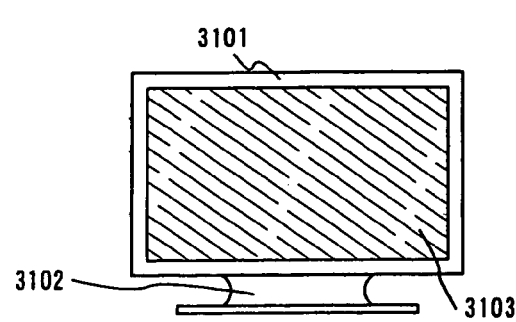

FIG. 11C shows a display including a main body 3101, a support base 3102, a display portion 3103 and the like. The present invention can be applied to display portion 3103. In addition, the display shown in FIG. 11C is small and medium type or large type, for example, a screen of the display sized 5 to 20 inches. Moreover, it is preferable to mass-produce by executing a multiple pattern using a substrate sized 1×1 m to form such sized display section.

As has been described, the range of applying the present invention is extremely wide and is applicable to electronic apparatuses of all the fields. The electronic apparatus of the present invention can be implemented by freely combined with the structures in Embodiments 1 to 5.

By layering a plurality of barrier films (AlNxOy film) of the invention, even when the barrier film suffers some cracks, other barrier film can effectively prevent mixture of impurities such as moisture and oxygen in the light emitting layer. Further, the barrier film (AlNxOy film) of the invention has such advantages that heat developed in the element is spread and deterioration of the element is suppressed and transformation and degeneration of the plastic substrate is protected.

In addition, the barrier film (AlNxOy film) of the invention can effectively prevent mixture of impurities such as alkaline metal and alkaline earth metal in an active layer of TFT and the light emitting layer.

Further, by sandwiching a stress relaxation film which stress is smaller as compared with the barrier film (AlNxOy film) of the invention between plural barrier layers, stress of an entire insulating film can be relaxed. Thus, even when an external force is applied, there occurs no bread-down and a flexible light emitting device can be obtained.

What is claimed is:

1. A light emitting device comprising:
 a substrate;
 a first insulating film over the substrate;
 a light emitting element over the first insulating film, the light emitting element having a cathode, an organic compound layer in contact with the cathode, and an anode in contact with the organic compound layer;
 a layer comprising Al, N and O over the light emitting element;
 a conductive film adhering a flexible print circuit in a terminal portion over the first insulating film; and
 a second insulating film over the layer comprising Al, N and O and the conductive film,
 wherein the light emitting element is covered by the layer comprising Al, N and O.

2. A light emitting device according to claim 1, wherein the layer comprising Al, N and O contains nitrogen of 2.5 atm % to 47.5 atm %.

3. A light emitting device according to claim 1, wherein the layer comprising Al, N and O contains a 13 group element or a 15 group element of 0.1 atm % to 5 atm % as impurities.

4. A light emitting device according to claim 1, wherein the layer comprising Al, N and O contains a phosphorous element or boron element of 0.1 atm % to 5atm %.

5. An electronic apparatus comprising the light emitting device according to claim 1, wherein the electronic apparatus is selected from the group consisting of a video camera, a digital camera, a goggle type display, a car navigation, a personal computer, and a portable information terminal.

6. A light emitting device according to claims 1, wherein the second insulating film is attached to the layer comprising Al, N and O and the conductive film by an adhesive layer.

7. A light emitting device according to claims 1, wherein the second insulating film comprises a plastic substrate.

8. A light emitting device comprising:
 a substrate;
 a first layer comprising Al, N and O on the substrate;
 a first insulating film over the first layer comprising Al, N and O;
 a light emitting element over the first insulating film, the light emitting element having a cathode, an organic compound layer in contact with the cathode, and an anode in contact with the organic compound layer;

a second layer comprising Al, N and O over the light emitting element;

a conductive film adhering a flexible print circuit in a terminal portion over the first insulating film; and a second insulating film over the second layer comprising Al, N and O and the conductive film, wherein the light emitting element is covered by the second layer comprising Al, N and O.

9. A light emitting device according to claim 8, wherein the first layer and the second layer comprising Al, N and O contain nitrogen of 2.5 atm % to 47.5 atm %.

10. A light emitting device according to claim 8, wherein the first layer and the second layer comprising Al, N and O contain a 13 group element or a 15 group element of 0.1 atm % to 5 atm % as impurities.

11. A light emitting device according to claim 8, wherein the first layer and the second layer comprising Al, N and O contain a phosphorous element or boron element of 0.1 atm % to 5 atm %.

12. An electronic apparatus comprising the light emitting device according to claim 8, wherein the electronic apparatus is selected from the group consisting of a video camera, a digital camera, a goggle type display, a car navigation, a personal computer, and a portable information terminal.

13. A light emitting device according to claims 8, wherein the second insulating film is attached to the layer comprising Al, N and O and the conductive film by an adhesive layer.

14. A light emitting device according to claims 8, wherein the second insulating film comprises a plastic substrate.

15. A light emitting device comprising:
a substrate;
a first layer comprising Al, N and O on the substrate;
a layer comprising organic resin on the first layer comprising Al, N and O;
a second layer comprising Al, N and O on the layer comprising organic resin;
a first insulating film over the second layer comprising Al, N and O;
a light emitting element over the first insulating film, the light emitting element having a cathode, an organic compound layer in contact with the cathode, and an anode in contact with the organic compound layer;
a third layer comprising Al, N and O over the light emitting element;
a conductive film adhering a flexible print circuit in a terminal portion over the first insulating film; and
a second insulating film over the third layer comprising Al, N and O and the conductive film,
wherein the light emitting element is covered by the third layer comprising Al, N and O.

16. A light emitting device according to claim 15, wherein the first layer, the second layer and the third layer comprising Al, N and O contain nitrogen of 2.5 atm % to 47.5 atm %.

17. A light emitting device according to claim 15, wherein the first layer, the second layer and the third layer comprising Al, N and O contain a 13 group element or a 15 group element of 0.1 atm % to 5 atm % as impurities.

18. A light emitting device according to claim 15, wherein the first layer, the second layer and the third layer comprising Al, N and O contain a phosphorous element or boron element of 0.1 atm % to 5 atm %.

19. A light emitting device according to claim 15, wherein stress of the layer comprising organic resin is smaller than that of the first layer and the second layer comprising Al, N and O.

20. A light emitting device according to claims 15, wherein the layer comprising organic resin comprises a layer adhering the substrate.

21. An electronic apparatus comprising the light emitting device according to claim 15, wherein the electronic apparatus is selected from the group consisting of a video camera, a digital camera, a goggle type display, a car navigation, a personal computer, and a portable information terminal.

22. A light emitting device according to claims 15, wherein the second insulating film is attached to the third layer comprising Al, N and O and the conductive film by an adhesive layer.

23. A light emitting device according to claims 15, wherein the second insulating film comprises a plastic substrate.

24. A light emitting device comprising:
a plastic substrate;
a first insulating film over the plastic substrate;
a light emitting element over the first insulating film, the light emitting element having a cathode, an organic compound layer in contact with the cathode, and an anode in contact with the organic compound layer;
a layer comprising Al, N and O over the light emitting element;
a conductive film adhering a flexible print circuit in a terminal portion over the first insulating film; and
a second insulating film over the layer comprising Al, N and O and the conductive film,
wherein the light emitting element is covered by the layer comprising Al, N and O.

25. A light emitting device according to claim 24, wherein the plastic substrate comprises at least one selected from the group consisting of polyimide, polyethylene sulfone, polycarbonate, polyethylene terephthalate and polyethylene naphthalate.

26. A light emitting device according to claim 24, wherein the layer comprising Al, N and O contains nitrogen of 2.5 atm % to 47.5 atm %.

27. A light emitting device according to claim 24, wherein the layer comprising Al, N and O contains a 13 group element or a 15 group element of 0.1 atm % to 5 atm % as impurities.

28. A light emitting device according to claim 24, wherein the layer comprising Al, N and O contains a phosphorous element or boron element of 0.1 atm % to 5 atm %.

29. An electronic apparatus comprising the light emitting device according to claim 24, wherein the electronic apparatus is selected from the group consisting of a video camera, a digital camera, a goggle type display, a car navigation, a personal computer, and a portable information terminal.

30. A light emitting device according to claims 24, wherein the second insulating film is attached to the layer comprising Al, N and O and the conductive film by an adhesive layer.

31. A light emitting device according to claims 24, wherein the second insulating film comprises a second plastic substrate.

32. A light emitting device comprising:
a plastic substrate;
a first layer comprising Al, N and O on the plastic substrate;
a first insulating film over the first layer comprising Al, N and O;
a light emitting element over the first insulating film, the light emitting element having a cathode, an organic compound layer in contact with the cathode, and an anode in contact with the organic compound layer;
a second layer comprising Al, N and O over the light emitting element;
a conductive film adhering a flexible print circuit in a terminal portion over the first insulating film; and a second insulating film over the second layer comprising Al, N and O and the conductive film, wherein the light emitting element is covered by the second layer comprising Al, N and O.

33. A light emitting device according to claim 32, wherein the plastic substrate comprises at least one selected from the group consisting of polyimide, polyethylene sulfone, polycarbonate, polyethylene terephthalate and polyethylene naphthalate.

34. A light emitting device according to claim 32, wherein the first layer and the second layer comprising Al, N and O contain nitrogen of 2.5 atm % to 47.5 atm %.

35. A light emitting device according to claim 32, wherein the first layer and the second layer comprising Al, N and O contain a 13 group element or a 15 group element of 0.1 atm % to 5 atm % as impurities.

36. A light emitting device according to claim 32, wherein the first layer and the second layer comprising Al, N and O contain a phosphorous element or boron element of 0.1 atm % to 5 atm %.

37. An electronic apparatus comprising the light emitting device according to claim 32, wherein the electronic apparatus is selected from the group consisting of a video camera, a digital camera, a goggle type display, a car navigation, a personal computer, and a portable information terminal.

38. A light emitting device according to claims 32, wherein the second insulating film is attached to the second layer comprising Al, N and O and the conductive film by an adhesive layer.

39. A light emitting device according to claims 32, wherein the second insulating film comprises a second plastic substrate.

40. A light emitting device comprising:
a plastic substrate;
a first layer comprising Al, N and O on the plastic substrate;
a layer comprising organic resin on the first layer comprising Al, N and O;
a second layer comprising Al, N and O on the layer comprising organic resin;
a first insulating film over the second layer comprising Al, N and O;
a light emitting element over the first insulating film, the light emitting element having a cathode, an organic compound layer in contact with the cathode, and an anode in contact with the organic compound layer;
a third layer comprising Al, N and O over the light emitting element;
a conductive film adhering a flexible print circuit in a terminal portion over the first insulating film; and
a second insulating film over the third layer comprising Al, N and O and the conductive film, wherein the light emitting element is covered by the third layer comprising Al, N and O.

41. A light emitting device according to claim 40, wherein the plastic substrate comprises at least one selected from the group consisting of polyimide, polyethylene sulfone, polycarbonate, polyethylene terephthalate and polyethylene naphthalate.

42. A light emitting device according to claim 40, wherein the first layer, the second layer and the third layer comprising Al, N and O contain nitrogen of 2.5 atm % to 47.5 atm %.

43. A light emitting device according to claim 40, wherein the first layer, the second layer and the third layer comprising Al, N and O contain a 13 group element or a 15 group element of 0.1 atm % to 5 atm % as impurities.

44. A light emitting device according to claim 40, wherein the first layer, the second layer and the third layer comprising Al, N and O contain a phosphorous element or boron element of 0.1 atm % to 5 atm %.

45. A light emitting device according to claim 40, wherein stress of the layer comprising organic resin is smaller than that of the first layer and the second layer comprising Al, N and O.

46. A light emitting device according to claims 40, wherein the layer comprising organic resin comprises a layer adhering the plastic substrate.

47. An electronic apparatus comprising the light emitting device according to claim 40, wherein the electronic apparatus is selected from the group consisting of a video camera, a digital camera, a goggle type display, a car navigation, a personal computer, and a portable information terminal.

48. A light emitting device according to claims 40, wherein the second insulating film is attached to the third layer comprising Al, N and O and the conductive film by an adhesive layer.

49. A light emitting device according to claims 40, wherein the second insulating film comprises a second plastic substrate.

* * * * *